(12) United States Patent
Miura et al.

(10) Patent No.: US 11,165,015 B2
(45) Date of Patent: Nov. 2, 2021

(54) MAGNETIC TUNNEL JUNCTION DEVICE, MAGNETORESISTIVE RANDOM ACCESS MEMORY USING SAME AND MANUFACTURING METHOD OF MAGNETIC TUNNEL JUNCTION DEVICE

(71) Applicant: HITACHI HIGH-TECH CORPORATION, Tokyo (JP)

(72) Inventors: Katsuya Miura, Tokyo (JP); Masaki Yamada, Tokyo (JP); Hirotaka Hamamura, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 15/906,775

(22) Filed: Feb. 27, 2018

(65) Prior Publication Data
US 2019/0051819 A1 Feb. 14, 2019

(30) Foreign Application Priority Data
Aug. 8, 2017 (JP) .............................. JP2017-153003

(51) Int. Cl.
*H01L 43/08* (2006.01)
*H01L 43/12* (2006.01)
(Continued)

(52) U.S. Cl.
CPC ............ *H01L 43/08* (2013.01); *H01L 27/228* (2013.01); *H01L 43/12* (2013.01); *H01L 43/02* (2013.01); *H01L 43/10* (2013.01)

(58) Field of Classification Search
None
See application file for complete search history.

(56) References Cited

U.S. PATENT DOCUMENTS 9,576,636 B1 2/2017 Slaughter
2006/0220084 A1 10/2006 Umehara et al.
(Continued)

FOREIGN PATENT DOCUMENTS

JP 2006261592 A 9/2006
JP 2008283018 A 11/2008
(Continued)

OTHER PUBLICATIONS

Machine language translation of WO 2018/079404 A1.*
(Continued)

*Primary Examiner* — Erik Kielin
(74) *Attorney, Agent, or Firm* — Miles & Stockbridge, P.C.

(57) ABSTRACT

A magnetic tunnel junction device includes a first ferromagnetic layer, a tunnel barrier that is in contact with the first ferromagnetic layer, and a synthetic ferrimagnetic reference layer that is in contact with the tunnel barrier while being in the other side of the first ferromagnetic layer, in which the synthetic ferrimagnetic reference layer includes a second ferromagnetic layer that has a first magnetization direction while being in contact with the tunnel barrier, a magnetic layer that has a second magnetization direction which is anti-parallel to the first magnetization direction, and a first nonmagnetic layer that is interposed between the second ferromagnetic layer and the magnetic layer, and lateral dimensions of the magnetic layer of the synthetic ferrimagnetic reference layer are made larger than lateral dimensions of the first ferromagnetic layer and the second ferromagnetic layer.

10 Claims, 23 Drawing Sheets

(51) Int. Cl.
*H01L 27/22* (2006.01)
*H01L 43/10* (2006.01)
*H01L 43/02* (2006.01)

(56) References Cited

U.S. PATENT DOCUMENTS

| | | | |
|---|---|---|---|
| 2007/0097731 A1* | 5/2007 | Abraham | G11C 11/1675 365/158 |
| 2007/0228501 A1* | 10/2007 | Nakamura | B82Y 25/00 257/421 |
| 2008/0278863 A1* | 11/2008 | Nishimura | B82Y 10/00 360/324.11 |
| 2008/0310216 A1 | 12/2008 | Miura | |
| 2009/0180312 A1 | 7/2009 | Miura et al. | |
| 2010/0080050 A1* | 4/2010 | Ozeki | G11C 11/5607 365/158 |
| 2011/0133298 A1 | 6/2011 | Chen et al. | |
| 2012/0300543 A1 | 11/2012 | Ohno et al. | |
| 2013/0094284 A1 | 4/2013 | Ohno et al. | |
| 2013/0099338 A1 | 4/2013 | Nakayama et al. | |
| 2014/0048896 A1* | 2/2014 | Huang | H01L 43/02 257/421 |
| 2014/0084402 A1 | 3/2014 | Shimomura et al. | |
| 2014/0315329 A1 | 10/2014 | Deshpande et al. | |
| 2017/0077394 A1 | 3/2017 | Saida | |
| 2017/0222132 A1 | 8/2017 | Pinarbasi et al. | |
| 2018/0182443 A1* | 6/2018 | Chia | H01L 43/08 |
| 2019/0064288 A1* | 2/2019 | Slaughter | G01R 33/098 |

FOREIGN PATENT DOCUMENTS

| | | |
|---|---|---|
| JP | 2009514211 A | 4/2009 |
| JP | 2011-258596 A | 12/2011 |
| JP | 2012-248688 A | 12/2012 |
| JP | 2013093349 A | 5/2013 |
| JP | 2014-179639 A | 9/2014 |
| JP | 2017059690 A | 3/2017 |
| KR | 20080109611 A | 12/2008 |
| KR | 20090067086 A | 6/2009 |
| TW | I474472 B | 2/2015 |
| WO | WO-2018079404 A1 * | 5/2018 |

OTHER PUBLICATIONS

U.S. Appl. No. 62/439,183.*
Office Action dated Apr. 25, 2019 in corresponding Taiwanese Application No. 107103019.
Office Action dated Jun. 20, 2019 in Korean Application No. 10-2017-0181971.
Office Action dated Jun. 24, 2020 in Korean Application No. 10-2017-0181971.
Office Action dated Dec. 1, 2020 in corresponding Japanese Application No. 2017-153003.

* cited by examiner

MAGNETIC TUNNEL JUNCTION DEVICE, MAGNETORESISTIVE RANDOM ACCESS MEMORY USING SAME AND MANUFACTURING METHOD OF MAGNETIC TUNNEL JUNCTION DEVICE

CLAIM OF PRIORITY

The present application claims priority from Japanese patent application JP 2017-153003 filed on Aug. 8, 2017, the content of which is hereby incorporated by reference into this application.

BACKGROUND OF THE INVENTION

Field of the Invention

The present invention relates to a magnetic random access memory (MRAM), and magnetic tunnel junction (MTJ) devices which work as memory cells of the MRAM, which have a structure realizing both high density and stability, and relates to a method for manufacturing MTJs.

Background Art

An MRAM is a resistance change type nonvolatile memory in which MTJ devices work as memory cells. A basic structure of the MTJ device is a three-layered structure: a first ferromagnetic layer, a tunnel barrier, and a second ferromagnetic layer. In general, one of the first ferromagnetic layer and the second ferromagnetic layer is a recording layer of which magnetization is variable, and the other is a reference layer of which magnetization is strongly pinned. A feature of the MTJ device is a point that the device resistance is changed depending on a relative angle of the magnetization of two ferromagnetic layers. When the magnetizations of the first and second ferromagnetic layers are parallel to each other (parallel state), the resistance of the MTJ device becomes low, and when the magnetizations of the first and second ferromagnetic layers are anti-parallel to each other (anti-parallel state), the resistance of the MTJ device becomes high. In the MRAM, two resistance states thereof respond to bit information. Therefore, since it is possible to retain a magnetization direction even if a power supply for MRAM is lost, the MRAM has nonvolatility. A general method for writing information is magnetization reversal of the recording layer realized by a spin-transfer torque which is generated by applying an electrical current to the MTJ device.

In the related art, a magnetic material with the magnetization direction of an in-plane direction with respect to a film surface, was generally applied to the first ferromagnetic layer and the second ferromagnetic layer. However, a case where the magnetization direction of the MTJ device is perpendicular to the film surface is suitable for miniaturization due to its large magnetic anisotropy. Therefore, a technology of materials in which both the large resistance change and the perpendicular magnetization are realized, is developed. JP-A-2011-258596, JP-A-2012-248688, and JP-A-2014-179639 are examples of the related art.

SUMMARY OF THE INVENTION

In the MTJ device (perpendicular magnetization MTJ device) having the magnetization of the perpendicular direction with respect to the film surface, there is a difference in thermal stability of the magnetization of the recording layer between the parallel and anti-parallel states. A reason for this difference is described using a basic MTJ device 100 having a three-layered structure, which is illustrated in FIGS. 1A and 1B, as an example. The basic MTJ device 100 is consist of a first ferromagnetic layer 101, a tunnel barrier 102, and a second ferromagnetic layer 103. FIG. 1A illustrates a parallel state where a magnetization 104 of the first ferromagnetic layer 101 and a magnetization 105 of the second ferromagnetic layer 103 are parallel to each other. FIG. 1B illustrates an anti-parallel state where the magnetization 104 of the first ferromagnetic layer 101 and the magnetization 105 of the second ferromagnetic layer 103 are anti-parallel to each other.

In the parallel state illustrated in FIG. 1A, since magnetic poles (the south pole of the magnetization 104 and the north pole of the magnetization 105) facing though the tunnel barrier 102 are different, attractive force acts on between the magnetizations 104 and 105. On the other hand, in the anti-parallel state illustrated in FIG. 1B, since the same magnetic poles (the north poles of the magnetizations 104 and 105) are facing through the tunnel barrier 102, repulsive force acts on between the magnetizations 104 and 105. Accordingly, in comparison with the parallel state, the anti-parallel state becomes unstable since the magnetic poles resist against each other, and a probability that it is not possible to maintain the anti-parallel state is increased. As a result, recording retention time which is guaranteed in the anti-parallel state is decreased.

Regarding the problem, in JP-A-2012-248688, by making an area of a reference layer larger than the area of a recording layer, a stray field which is applied to a first ferromagnetic layer 101 (recording layer) from a second ferromagnetic layer 103 (reference layer) is decreased. According to this method, the MTJ device has a step structure at a tunnel barrier 102 (an upper side interface or a lower side interface of a tunnel barrier 102). In the structure, since it is possible to prevent the decrease of the recording retention time as the increase of the area of the reference layer in comparison with the recording layer, the area of the reference layer ought to be made huge in order to obtain a large recording retention effect. Therefore, the miniaturization of the MTJ device may be hindered.

JP-A-2014-179639 discloses an MTJ device in which an area of a reference layer is made larger than the area of a recording layer in the same manner as in JP-A-2012-248688, and the reference layer is made into a synthetic ferrimagnetic structure. The synthetic ferrimagnetic structure is basically consist of a three-layered structure of a ferromagnetic layer/a nonmagnetic layer/a ferromagnetic layer. In a case where the synthetic ferrimagnetic structure is adopted to the reference layer, a structure including three layers of a ferromagnetic layer/a nonmagnetic layer/a ferromagnetic layer is adopted instead of a second ferromagnetic layer 103 (reference layer). At that time, a material and a film thickness of the nonmagnetic layer in the synthetic ferrimagnetic structure are selected such that the magnetizations of two ferromagnetic layers in the synthetic ferrimagnetic structure are fixed to be anti-parallel to each other. Saturation magnetization, a lateral size of MTJs, and a thickness of each ferromagnetic layer are set such that the stray fields from two ferromagnetic layers which are anti-parallel to each other are canceled out each other in the recording layer. Because there is a need to accurately control each film thickness at an atomic layer level in the structure, however, it is difficult to reduce the stray field which is applied to the recording layer.

The following is a representative outline of aspects of the invention disclosed herein, which is simply described. An MTJ device according to one embodiment includes a synthetic ferrimagnetic structure as a reference layer, and areas of two magnetic layers configuring the synthetic ferrimagnetic structure are different from each other.

There is provided an MTJ device that prevents a decrease of recording retention time in an anti-parallel state, and is suitable for miniaturization.

DETAILED DESCRIPTION OF THE INVENTION

Figure 1A:
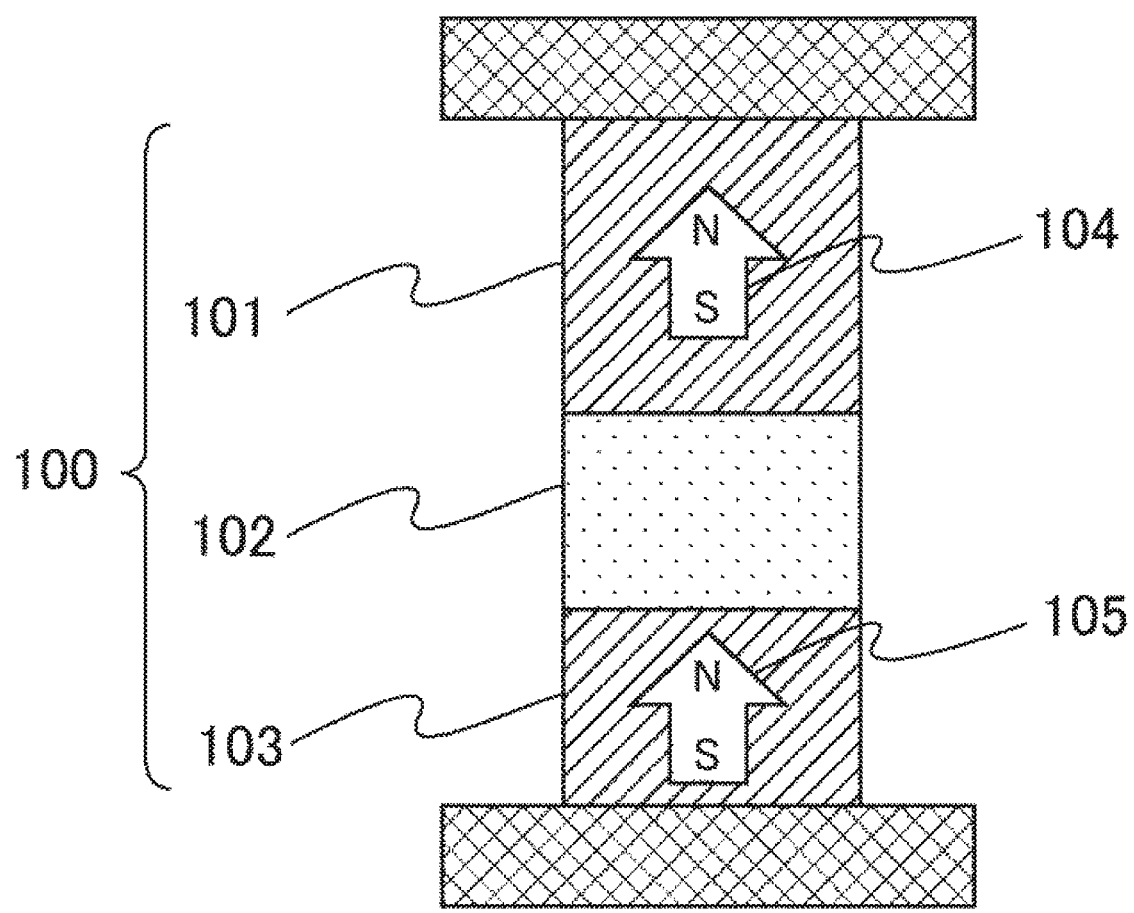
FIG. 1A is a diagram for describing a magnetization alignment (parallel state) of a perpendicular magnetization MTJ device.
Figure 1B:
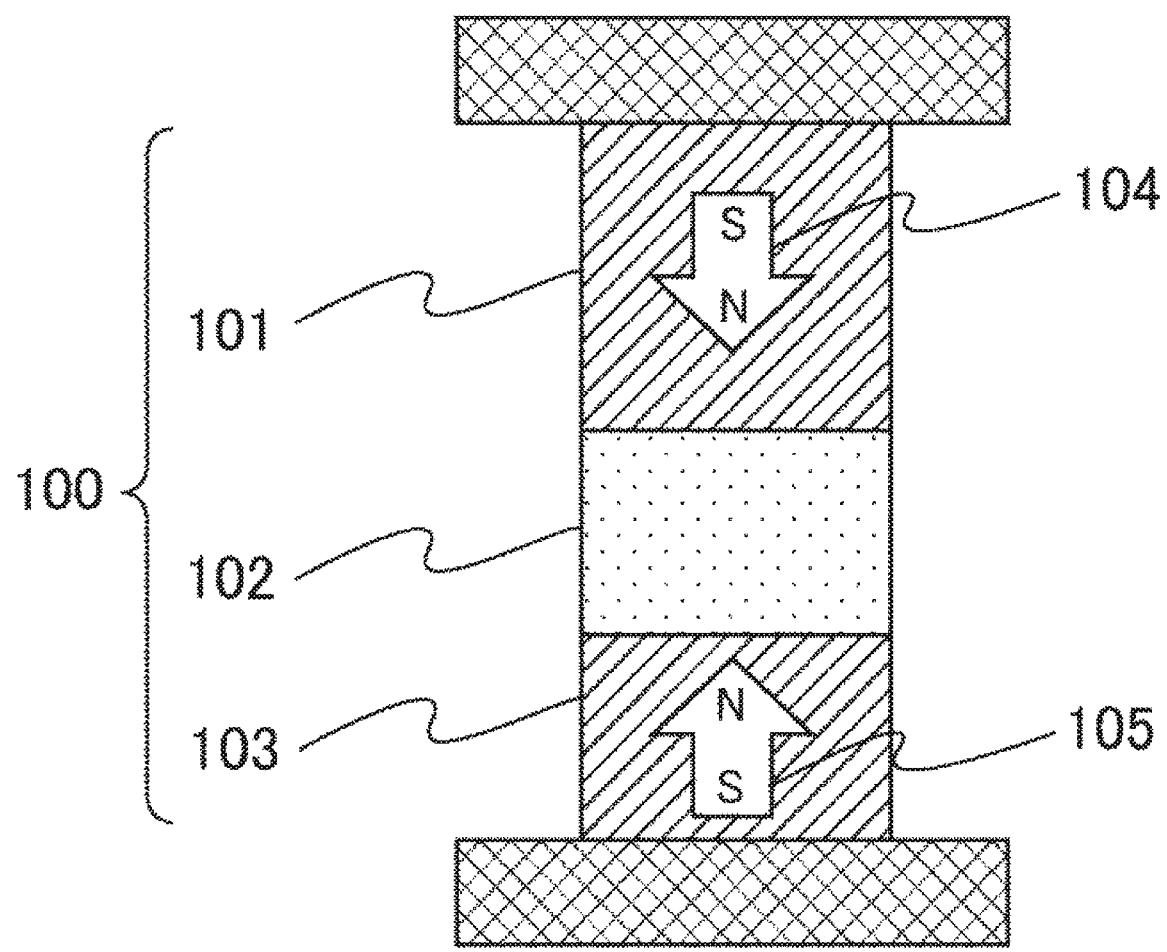
FIG. 1B is a diagram for describing a magnetization alignment (anti-parallel state) of the perpendicular magnetization MTJ device.

Hereinafter, in embodiments when there is the necessity for the sake of convenience, a case of being divided into a plurality of sections or embodiments will be described, but except for a case of being particularly stated, the embodiments are not unrelated to each other, and have a relationship such as a modification example, a detailed description, or a supplementary description such that one thereof is a portion or all of the other.

In a case where the number (including the number, a numerical value, a quantity, a range, or the like) of components is stated, a value is not limited to a specific number, and the value may be the specific number or more, or the specific number or less, except for a case of being particularly stated and a case of being clearly limited to the specific number in principle.

The component (including a component step or the like) is not necessarily indispensable, except for a case of being particularly stated and a case of being clearly indispensable in principle.

In the same manner, in a case where a shape, a positional relationship, or the like of the component is stated, the component which is substantially approximate or similar in the shape or the like is included therein, except for a case of being particularly stated and a case of being clearly considered that it is not so in principle. The numerical value is made the same as this manner.

In all drawings for describing the embodiments, the same member is denoted by the same sign as a general rule, and the repeated description thereof will be omitted. In order to easily understand the drawing, there is a case where hatching may be attached even in a plan view, and there is a case where the hatching may be omitted even in a sectional view.

EXAMPLE 1

Figure 2:
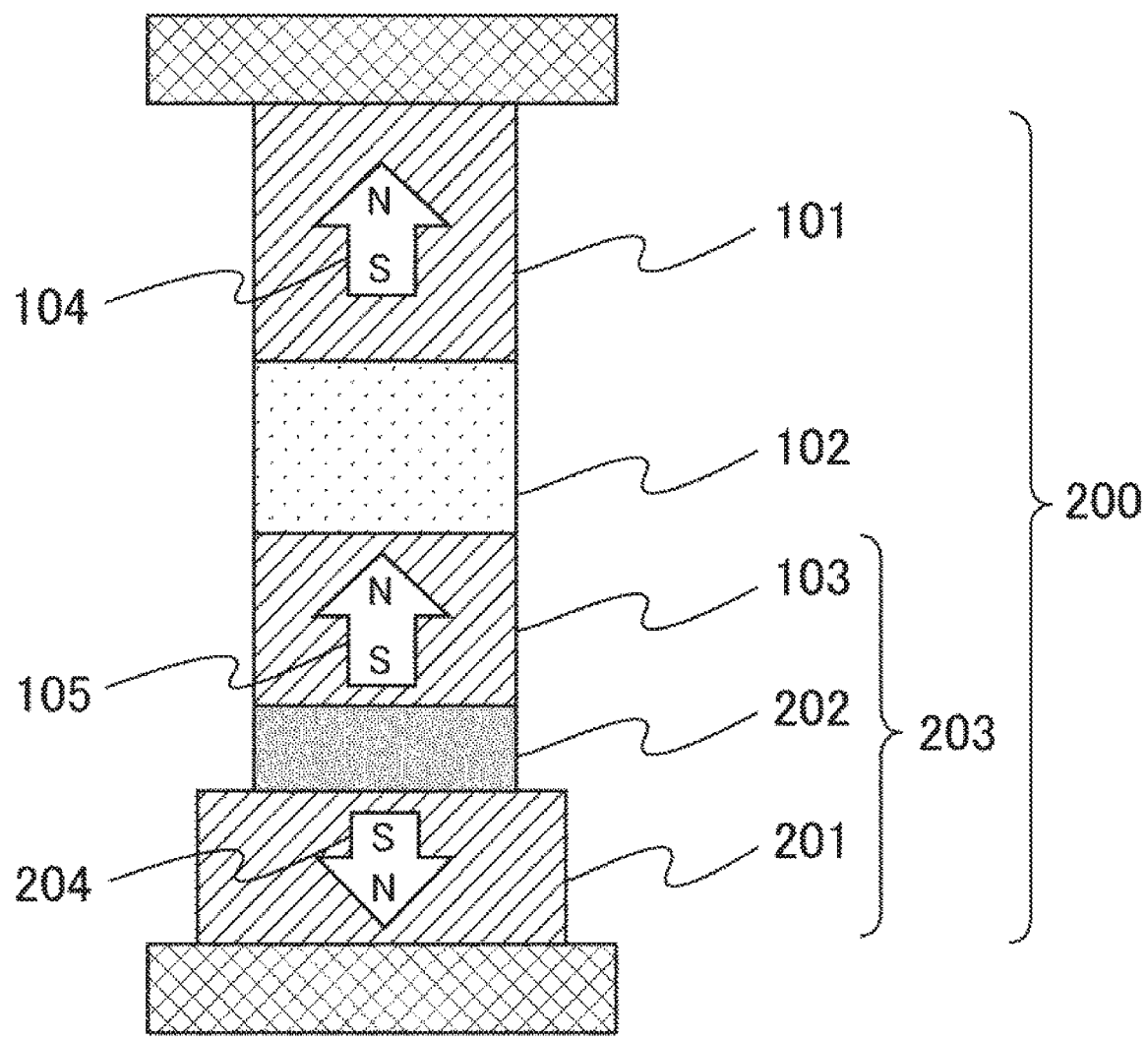
FIG. 2 is a sectional view of a perpendicular magnetization MTJ device (first structure example).

A structure (first structure example) of an MTJ device according to the embodiment will be described using FIG. 2. FIG. 2 is a sectional view illustrating an example of the MTJ device according to the embodiment. An MTJ device 200 is manufactured by using a sequentially stacked multilayer film consisting of, from a lower side, a third ferromagnetic layer 201, a first nonmagnetic layer 202, a second ferromagnetic layer 103, a tunnel barrier 102, and a first ferromagnetic layer 101. A synthetic ferrimagnetic reference layer 203 consists of the third ferromagnetic layer 201, the first nonmagnetic layer 202, and the second ferromagnetic layer 103. Therefore, a material and a film thickness of the first nonmagnetic layer 202 are determined such that a magnetization 204 of the third ferromagnetic layer 201 and a magnetization 105 of the second ferromagnetic layer 103 are aligned to be anti-parallel to each other. The first ferromagnetic layer 101 operates as a recording layer.

The MTJ device is processed into a pillar shape such as a column, and areas of the third ferromagnetic layer 201 and the second ferromagnetic layer 103, which work as the synthetic ferrimagnetic reference layer 203, are processed to be different from each other. In the example of FIG. 2, the first ferromagnetic layer 101, the tunnel barrier 102, and the second ferromagnetic layer 103 make a first pillar, and the third ferromagnetic layer 201 makes a second pillar that has lateral dimensions which are larger than that of the first pillar. Thereby, the structure has a step between the third ferromagnetic layer 201 and the second ferromagnetic layer 103. A similar benefit is obtained even in a case where the cross section of the synthetic ferrimagnetic reference layer 203 is processed into a tapered shape, and the area of the third ferromagnetic layer 201 and the area of the second ferromagnetic layer 103 are made discontinuous. However, it is desirable to form the third ferromagnetic layer 201 of the pillar shape and the second ferromagnetic layer 103 of the pillar shape of which the areas are different from each other (adopting the step) because performance of the MTJ device is easily optimized.

The synthetic ferrimagnetic reference layer 203 has an effect of preventing a stray field, which is generated from the reference layer, by aligning the magnetization 204 and the magnetization 105 to be anti-parallel to each other. However, the stray field which exits at the recording layer 101 from the synthetic ferrimagnetic reference layer 203 rapidly increases in the vicinity of an edge of the reference layer. This is because a demagnetization field is small in the vicinity of the edge. Therefore, the area of the third ferromagnetic layer 201 is made large, to decrease the stray field from the edge of the third ferromagnetic layer 201 on the first ferromagnetic layer 101 (recording layer). A region in which the stray field increases due to the edge (in the vicinity of the edge) is generally considered to be approximately 2 nm to 5 nm from the edge.

Figure 3:
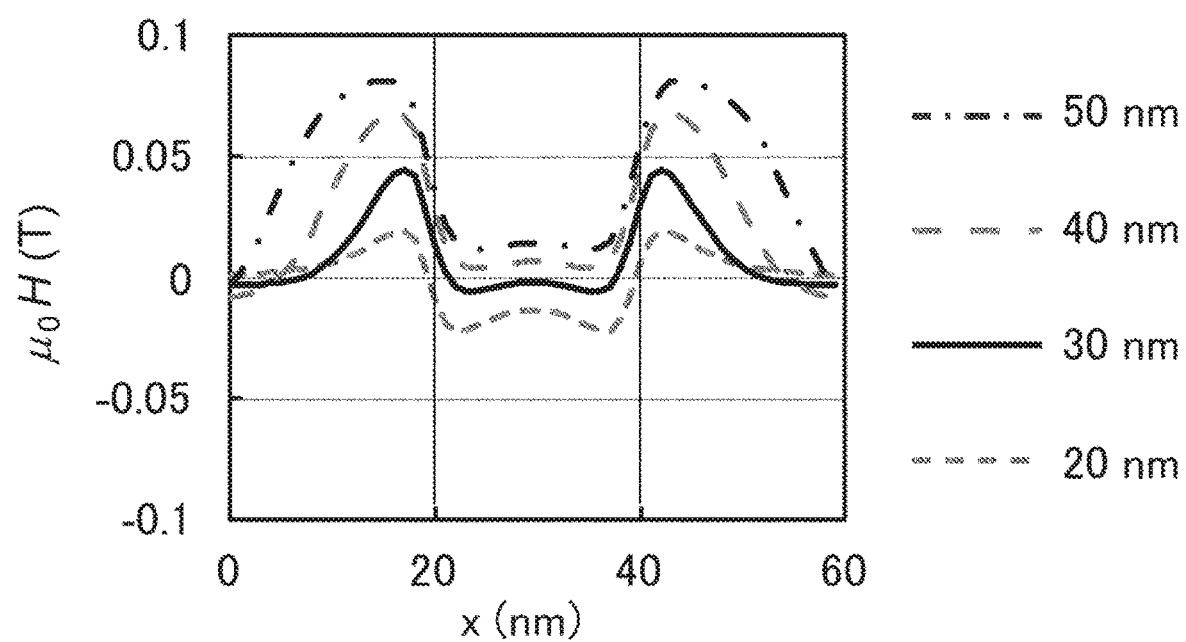
FIG. 3 is a graph illustrating a magnitude of a stray field which is applied to a recording layer from a reference layer as a function of lateral position of the MTJ device.

FIG. 3 illustrates a magnitude of the stray field which is applied to the recording layer (first ferromagnetic layer 101) from the synthetic ferrimagnetic reference layer 203 in the MTJ device illustrated in FIG. 2. In this case, the magnitude of the stray field is simulated by using the MTJ device with a diameter of the recording layer (first ferromagnetic layer 101) is 20 nm, and the diameter of the third ferromagnetic layer 201, which is a part of the synthetic ferrimagnetic reference layer 203, is four sorts of 20 nm, 30 nm, 40 nm, and 50 nm. The position of the recording layer of the MTJ device is set in the range from 20 nm to 40 nm on a horizontal axis of FIG. 3. The position of the third ferromagnetic layer 201 is set in each of the range from 20 nm to 40 nm, from 15 nm to 45 nm, from 10 nm to 50 nm, and from 5 nm to 55 nm on the horizontal axis of FIG. 3. A vertical axis indicates the stray field which is applied to the recording layer at the position in each case. If an absolute value of the stray field is close to zero in the range from 20 nm to 40 nm on the horizontal axis in which the recording layer exists, the retention time of the recording layer increases.

From FIG. 3, it is found that the stray field is close to zero in the range which is from 20 nm to 40 nm on the horizontal axis, in a case where the diameter of the third ferromagnetic layer 201 is 30 nm (waveform of a solid line). In a case of the diameter of the third ferromagnetic layer 201 is 20 nm, the stray field in a minus direction applying to the recording layer increases in the comparison with the case of 30 nm in the diameter. In a case where the diameter of the third ferromagnetic layer 201 is increased to 40 nm, and 50 nm, the stray field which is applied to the recording layer becomes gradually large in a plus direction. From the above description, the retention time has a maximum when the diameter of the third ferromagnetic layer 201 is 30 nm.

As mentioned above, the MTJ device 200 has a clear difference from the MTJ device disclosed in the example of the related art. Since there is the step at the tunnel barrier in a cross section structure, the MTJ device disclosed in JP-A-2012-248688 or JP-A-2014-179639 has the structure in which the stray field that is applied to the recording layer decreases as the increase of the reference layer that is lower than the tunnel barrier. On the contrary, in a case where the step exists between two ferromagnetic layers in the synthetic ferrimagnetic reference layer 203 in the same manner as the MTJ device 200, optimized structure can be obtained by controlling a relationship with the areas of the recording layer and the third ferromagnetic layer 201. Therefore, there is no need to make a footprint of a memory cell so large, and the structure is suitable for miniaturization.

Any material as long as a resistance change becomes large in a parallel state and an anti-parallel state of the MTJ device can be adopted for the tunnel barrier 102 and oxide materials are frequently used. In particular, since it is known that MgO exhibits the large resistance change, it is desirable to use MgO. A magnetic material including at least one 3d transition metal element is used for the first ferromagnetic layer 101 and the second ferromagnetic layer 103 which are in contact with the tunnel barrier 102. In particular, adopting CoFeB for the first ferromagnetic layer 101 and the second ferromagnetic layer 103 exhibits excellent properties by combining with MgO. In a case of the MTJ device 200 according to the embodiment, CoFeB can be applied to the third ferromagnetic layer 201 in the same manner. However, it is possible to use a magnetic material including at least one 3d transition metal element. It is desirable to use Ru for the material of the first nonmagnetic layer 202 in order to obtain the strong anti-parallel alignment between the magnetization 204 of the third ferromagnetic layer 201 and the magnetization 105 of the second ferromagnetic layer 103.

Figure 4:
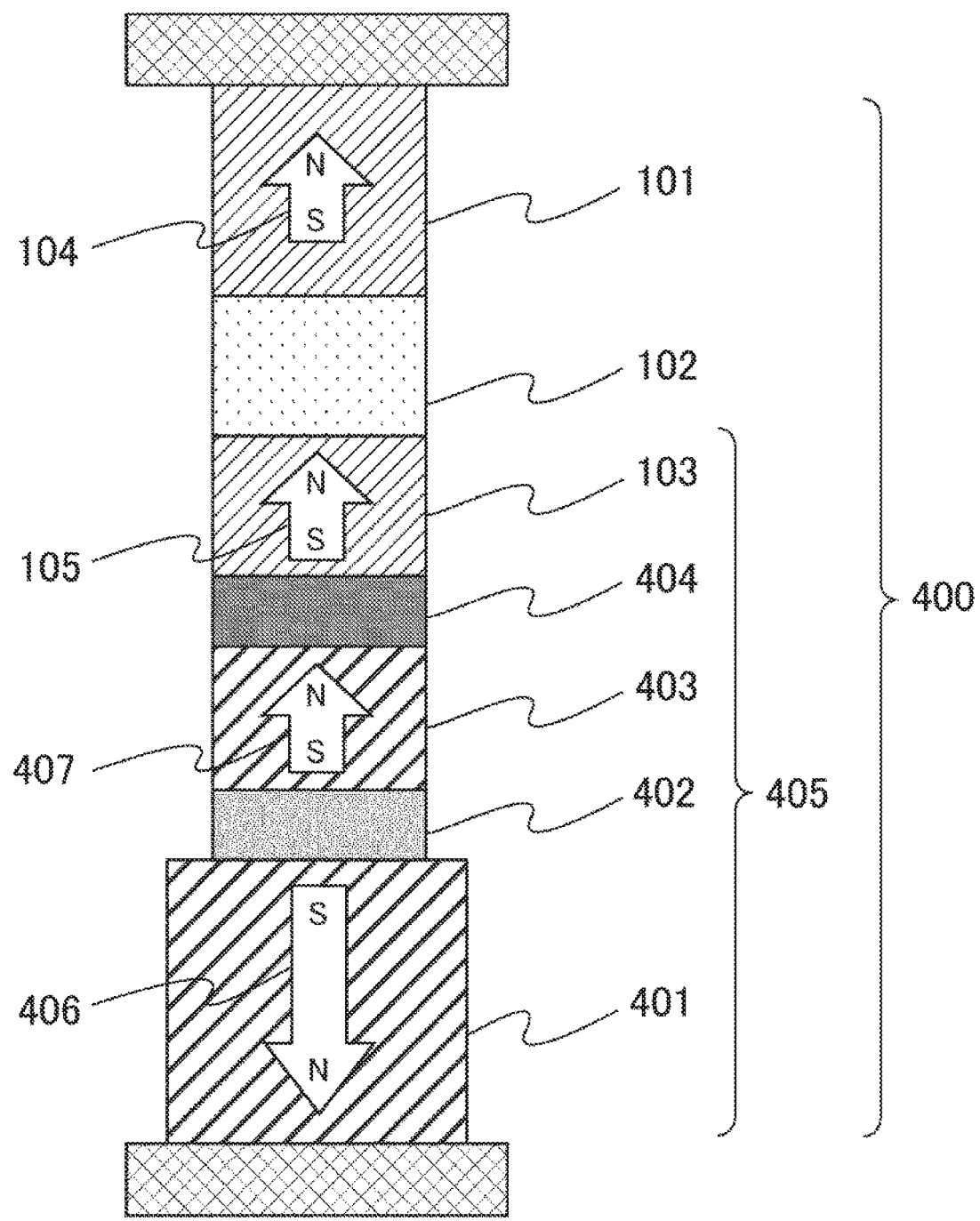
FIG. 4 is a sectional view of a perpendicular magnetization MTJ device (second structure example).

It is desirable to use CoFeB on a surface which is in contact with MgO as described above. However, other magnetic materials except for CoFeB are suitable for the layers which are not contact with MgO can be adopted. In particular, in order to increase magnetic anisotropy of the reference layer, a magnetic multilayer films such as Co/Pt multilayer can be used. FIG. 4 illustrates a structure (second structure example) of an MTJ device 400, which adopts magnetic multilayers. The MTJ device 400 is manufactured by using a sequentially stacked multilayer film consisting of, from a lower side, first magnetic multilayers 401, a first nonmagnetic layer 402, second magnetic multilayers 403, a second nonmagnetic layer 404, the second ferromagnetic layer 103, the tunnel barrier 102, and the first ferromagnetic layer 101. A synthetic ferrimagnetic reference layer 405 is consist of the first magnetic multilayers 401, the first nonmagnetic layer 402, the second magnetic multilayers 403, the second nonmagnetic layer 404, and the second ferromagnetic layer 103. The material and the film thickness of the first nonmagnetic layer 402 are determined such that a magnetization 406 of the first magnetic multilayers 401 and a magnetization 407 of the second magnetic multilayers 403 are aligned to be anti-parallel to each other. The material and the film thickness of the second nonmagnetic layer 404 are determined such that the magnetization 407 of the second magnetic multilayers 403 and the magnetization 105 of the second ferromagnetic layer 103 are aligned to be parallel to each other. The first ferromagnetic layer 101 works as a recording layer.

In the example of FIG. 4, the first ferromagnetic layer 101, the tunnel barrier 102, the second ferromagnetic layer 103, the second nonmagnetic layer 404, and the second magnetic multilayers 403 make the first pillar, and the first magnetic multilayers 401 makes the second pillar that has lateral dimensions which are larger than that of the first pillar. Thereby, the structure has a step between the first magnetic multilayers 401 and the second magnetic multilayers 403.

It is possible to use the multilayers such as Co/Pt, Co/Pd, CoFe/Pt for the first magnetic multilayers 401. It is also possible to use an alloy such as TbFeCo instead of the magnetic multilayers. The Ru can be selected as a material of the first nonmagnetic layer 402 such that the magnetization 406 of the first magnetic multilayers 401 and the magnetization 407 of the second magnetic multilayers 403 are aligned to be anti-parallel to each other. In this case, the film thickness of Ru is approximately 0.3 nm. The Ta can be selected as a material of the second nonmagnetic layer 404 such that the magnetization 407 of the second magnetic multilayers 403 and the magnetization 105 of the second ferromagnetic layer 103 are aligned to be parallel to each other. In this case the film thickness of Ta is approximately 0.5 nm.

An advantage of the second structure example is that a magnetization direction of the reference layer is stable. This is because the magnetic anisotropy in the Co/Pt multilayer is larger than that of CoFeB, and the magnetization direction is easily stabilized in the magnetic multilayers. As a result, this structure contributes to suppress the false operation of MRAMs.

Figure 5A:
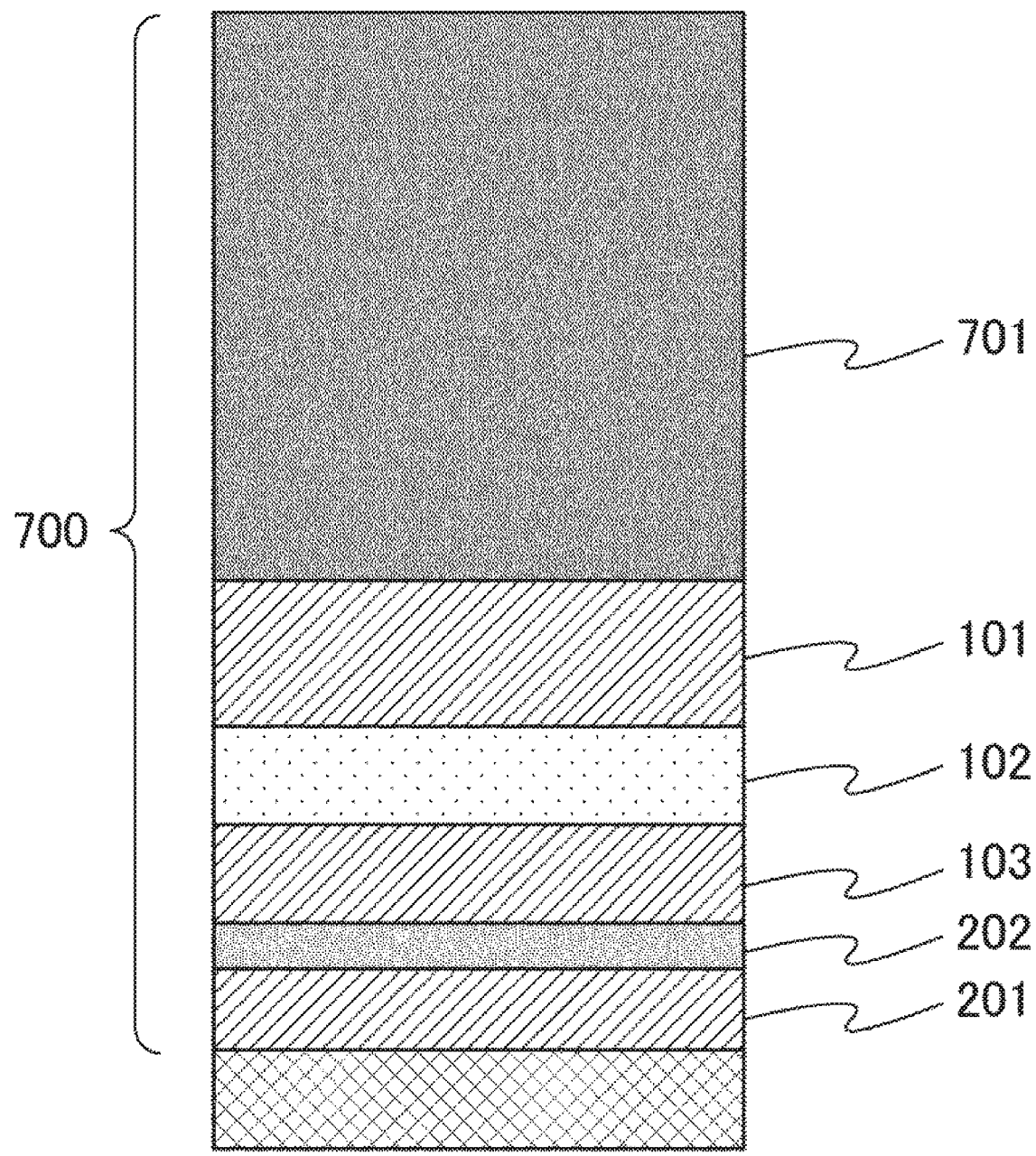
FIGS. 5A to 5F are process flows of the perpendicular magnetization MTJ device.
Figure 5B:
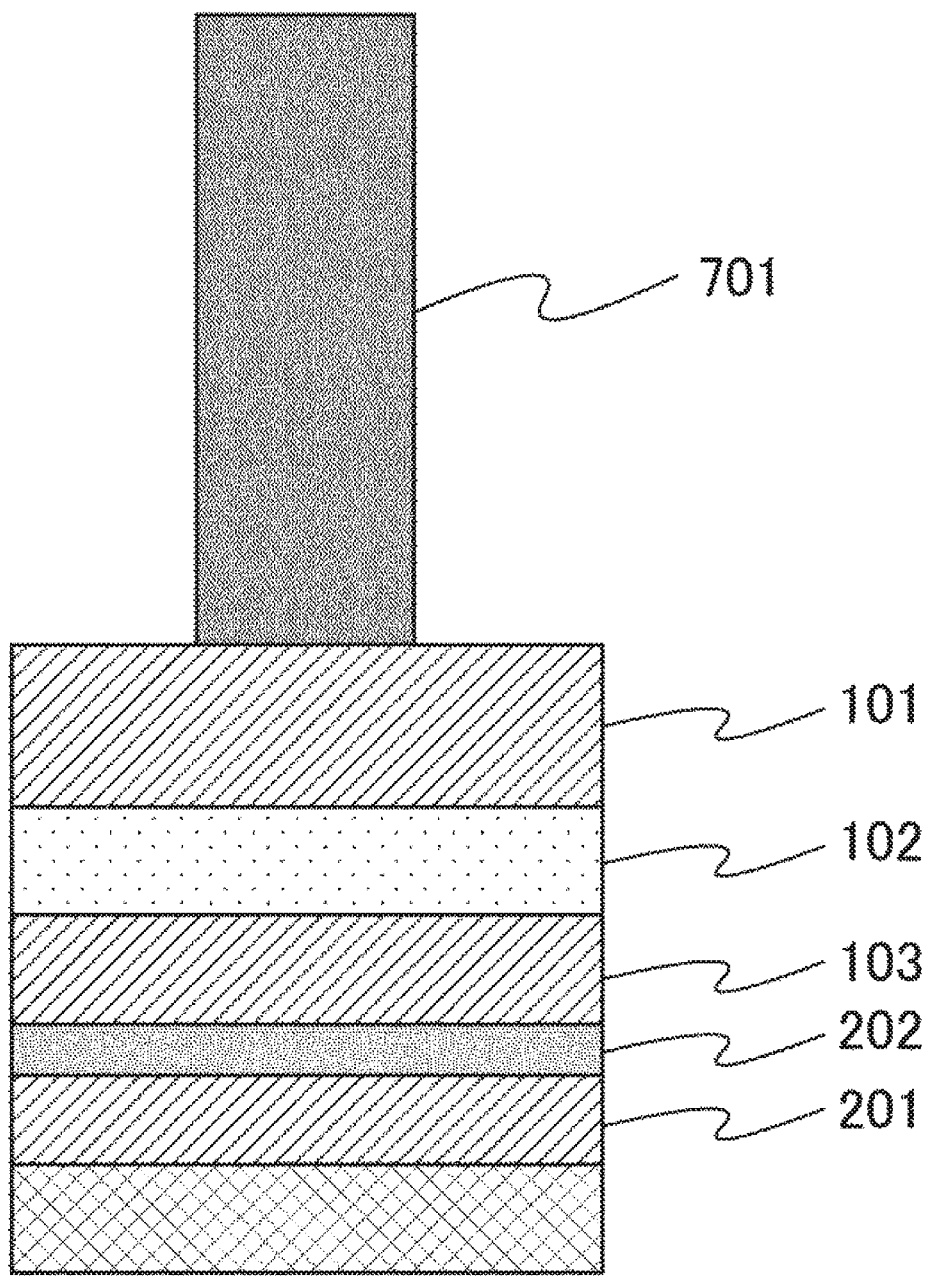

Next, a process of manufacturing the MTJ device of the first structure example illustrated in FIG. 2 is described. FIG. 5A illustrates a sequentially stacked multilayer film 700 consisting of, from a lower side, the third ferromagnetic layer 201, the first nonmagnetic layer 202, the second ferromagnetic layer 103, the tunnel barrier 102, and the first ferromagnetic layer 101, and a hard mask layer 701. The film thickness of the third ferromagnetic layer 201 is 1 nm, the film thickness of the first nonmagnetic layer 202 is 0.5 nm, the film thickness of the second ferromagnetic layer 103 is 1 nm, the film thickness of the tunnel barrier 102 is 1 nm, the film thickness of the first ferromagnetic layer 101 is 1.5 nm, and the film thickness of the hard mask layer 701 is 150 nm. In this case, the monolayer of Ta is used as a hard mask layer 701 as an example, but the combination of Ta and other materials such as an oxide can be used. A resist mask is formed using lithography, and a pattern is transferred to the hard mask layer 701. FIG. 5B illustrates a sectional structure after fabricating the hard mask layer 701, which has the pillar shape with the diameter of 20 nm.

Figure 5C:
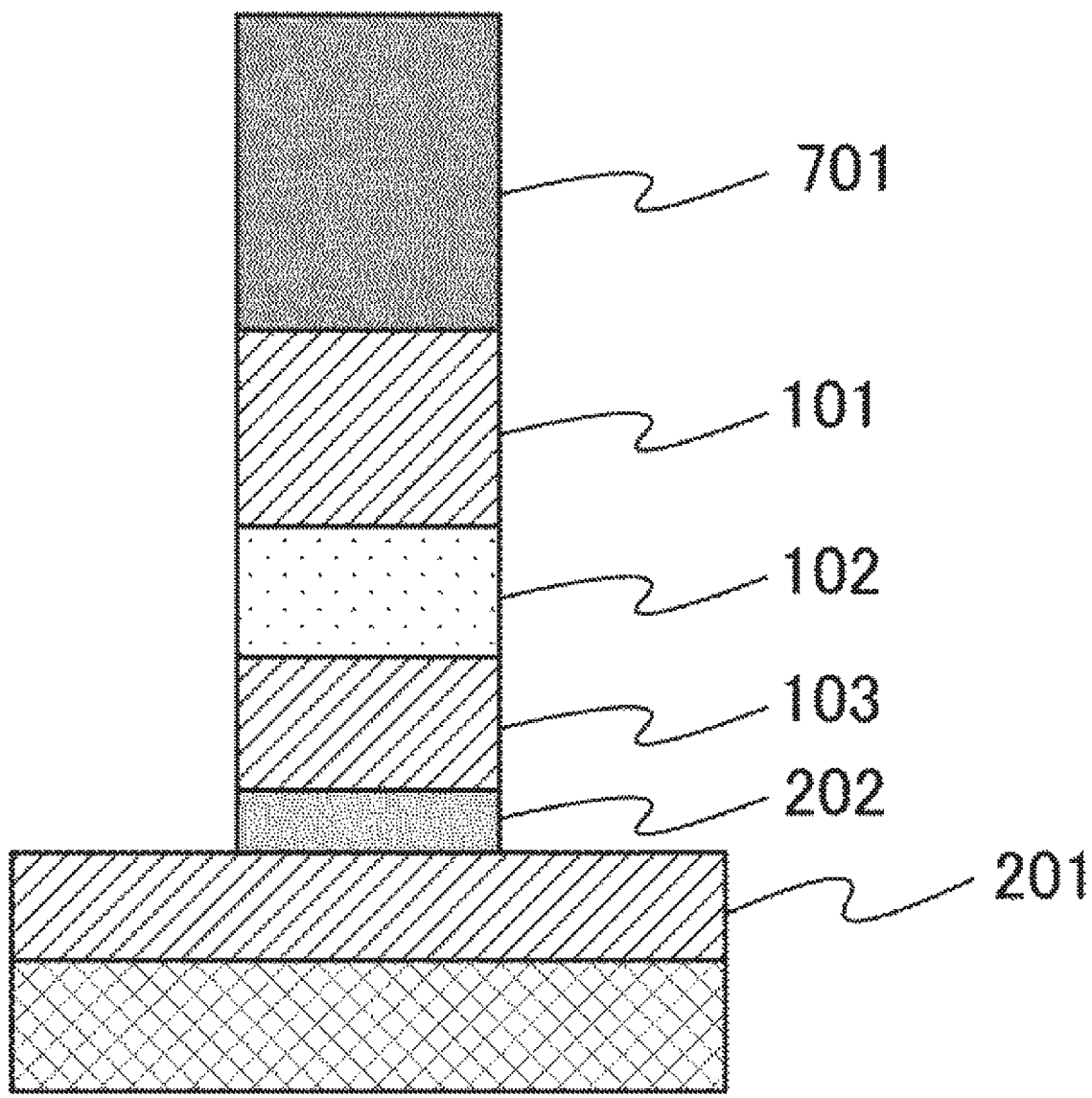

Next, the first ferromagnetic layer 101, the tunnel barrier 102, the second ferromagnetic layer 103, and the first nonmagnetic layer 202 are processed by plasma etching with the hard mask layer 701 as a mask. FIG. 5C illustrates a sectional image of MTJ device after the plasma etching. Although the plasma etching is stopped at the surface of the third ferromagnetic layer 201 in FIG. 5C, the plasma etching can be stopped in a middle of the first nonmagnetic layer 202 (before the etching reaches the surface of the third ferromagnetic layer 201). This is because the benefit of this invention can be obtained as long as the step is formed between the third ferromagnetic layer 201 and the first ferromagnetic layer 101. Due to the plasma etching, in these cases, the film thickness of the hard mask layer 701 decreases (to 50 nm) from the initial film thickness.

Figure 5D:
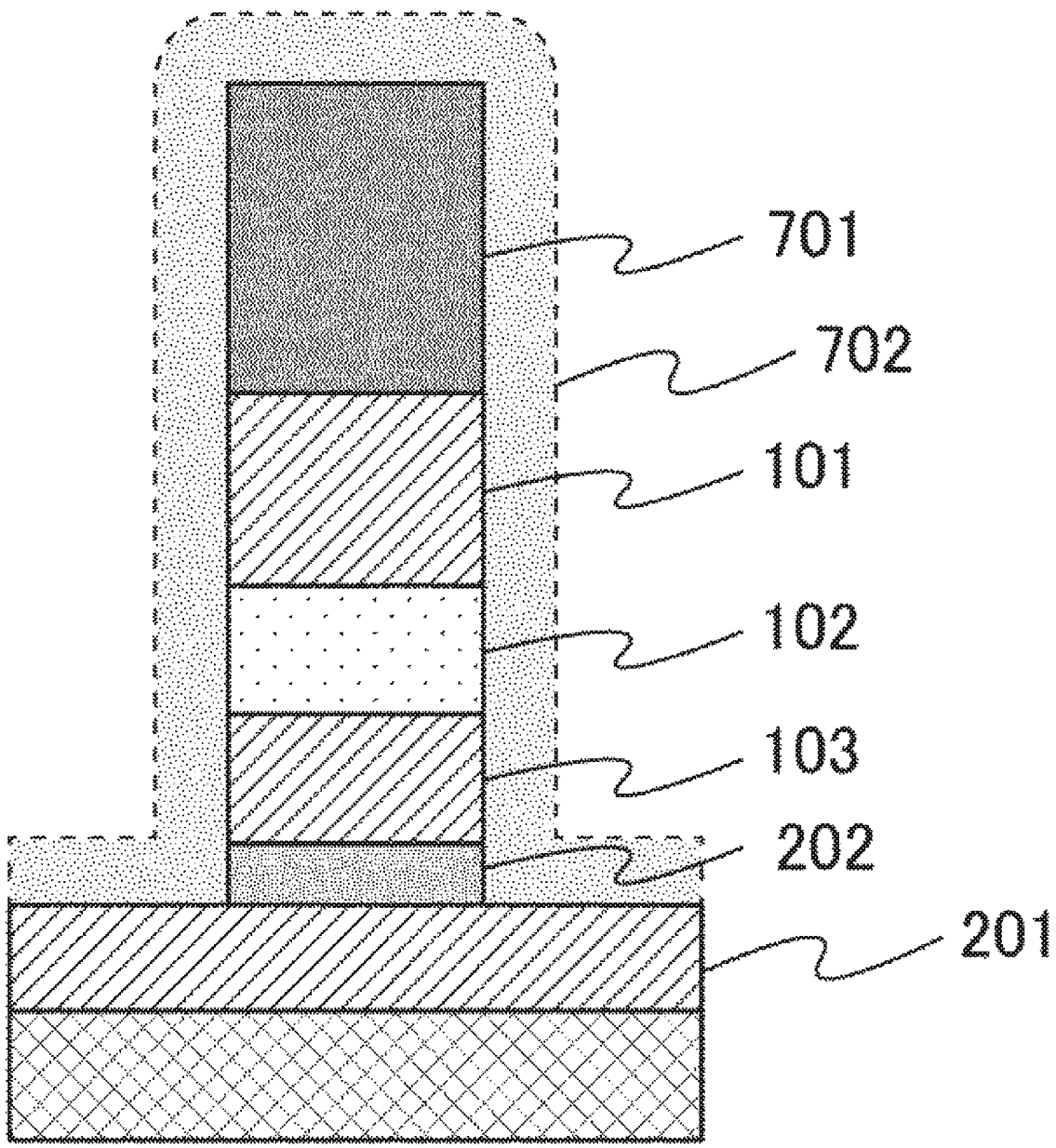
Figure 5E:
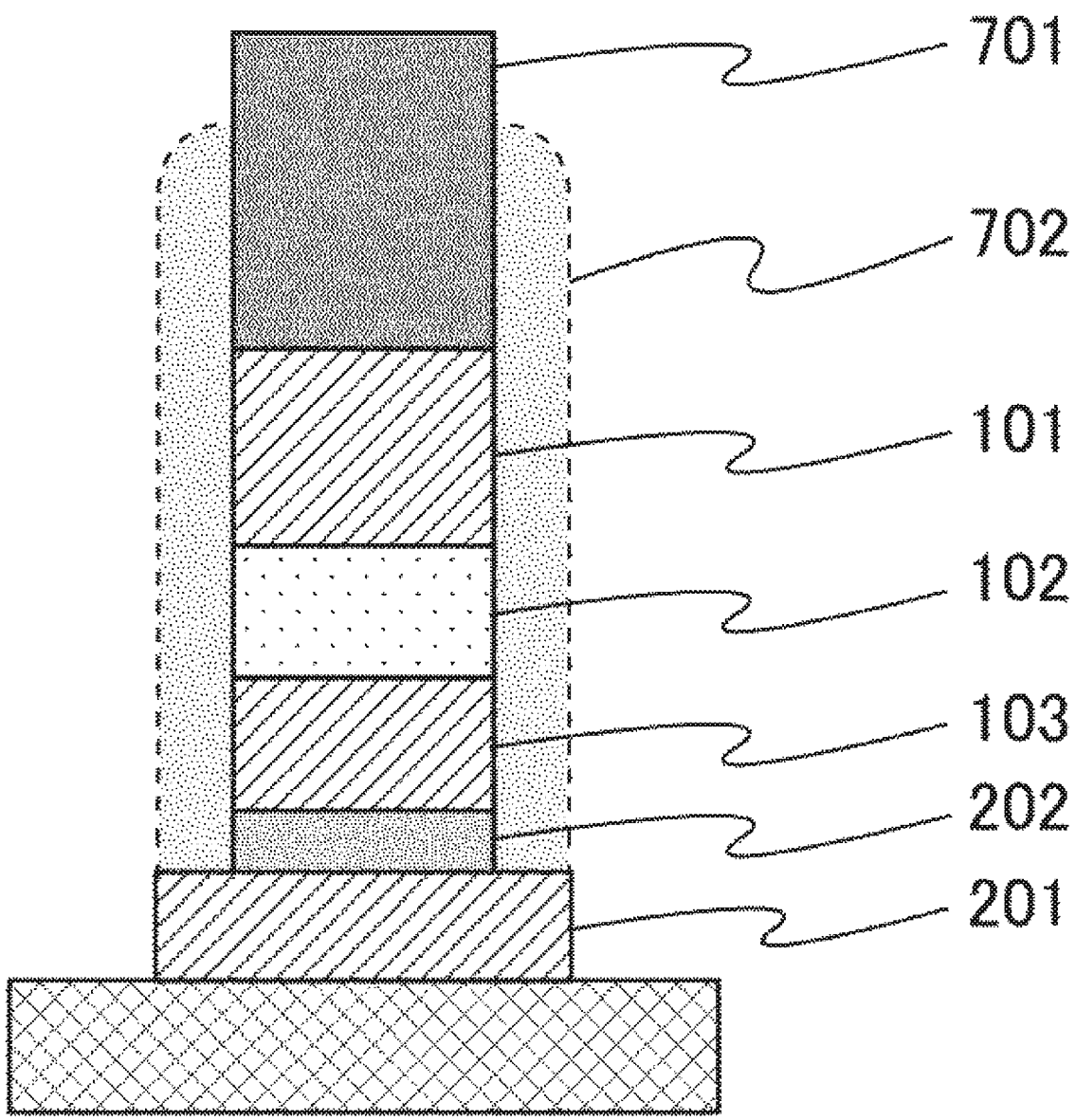

Next, FIG. 5D is a sectional view of MTJ device after developing a side wall deposition layer 702 with conformal shape using chemical vapor deposition (CVD). Since the ferromagnetic layer and the tunnel barrier in the MTJ device are exposed in this situation, it is desirable that the MTJ device is transported to a CVD apparatus in a vacuum without exposure in the atmosphere. The SiN is used for the side wall deposition layer 702, but it is possible to apply other insulator such as SiO. The side wall deposition layer 702 works as a mask for plasma etching process of the third ferromagnetic layer 201. Regarding the fabricating MTJ device, the first nonmagnetic layer 202, the second ferromagnetic layer 103, the tunnel barrier 102, and the first ferromagnetic layer 101 have the pillar shape with the diameter of 20 nm, and the third ferromagnetic layer 201 has the pillar shape with the diameter of 30 nm. Therefore, the film thickness of the side wall deposition layer 702, which is fabricated on the first nonmagnetic layer 202, the second ferromagnetic layer 103, the tunnel barrier 102, and the first ferromagnetic layer 101, supposed to be 5 nm. Thereby, the third ferromagnetic layer 201 having the pillar shape with the diameter of 5 nm+20 nm+5 nm=30 nm is obtained by the plasma etching using the side wall deposition layer 702 having the film thickness of 5 nm and the hard mask layer 701 having the film thickness of 20 nm as a mask. FIG. 5E illustrates a sectional image of MTJ device after the plasma etching of the third ferromagnetic layer 201.

Figure 5F:
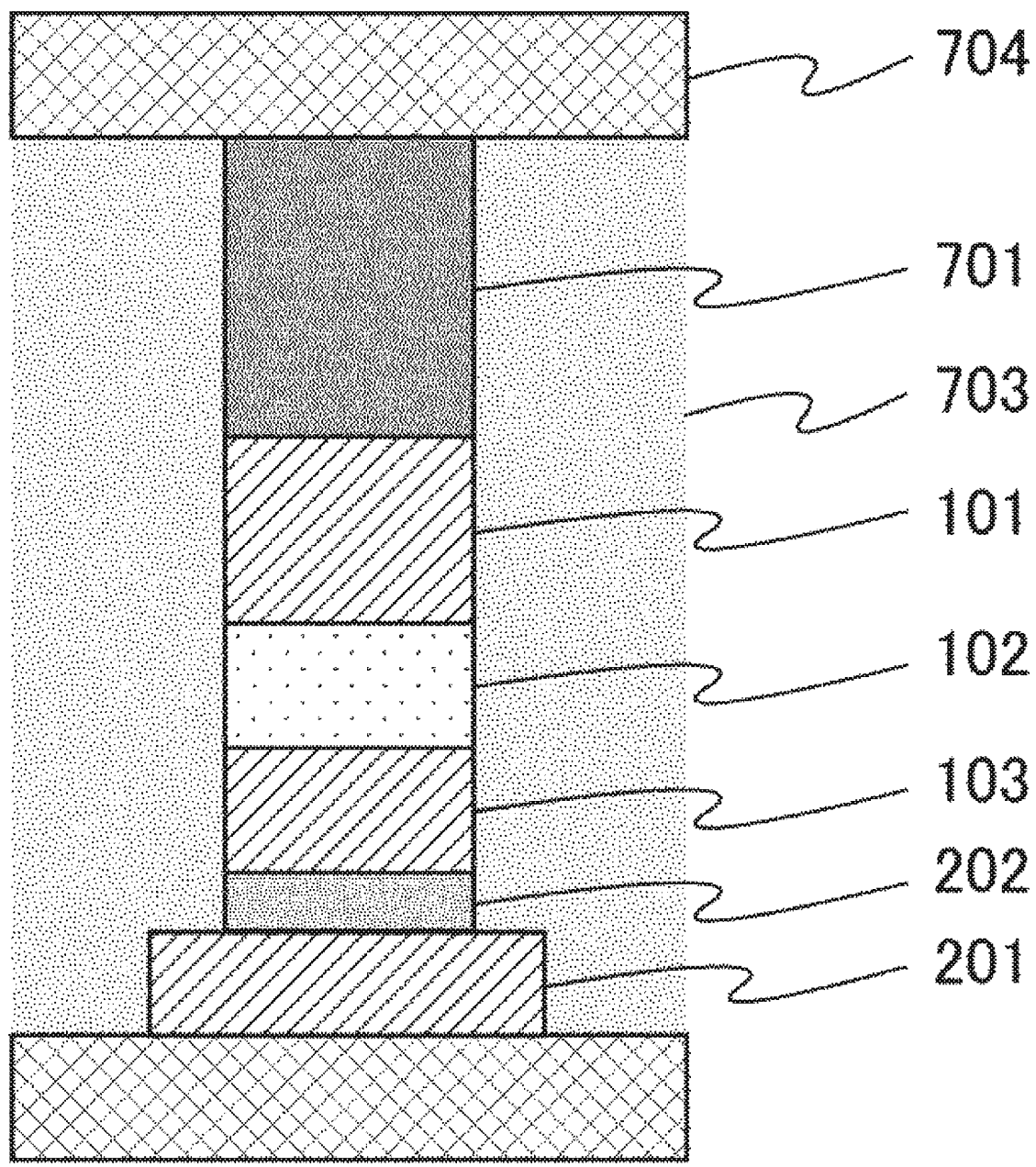

Thereafter, an interlayer insulating film 703 is added by the CVD, a top surface of the hard mask layer 701 is opened as a contact by chemical mechanical polishing (CMP) or an etch-back treatment, and an upper electrode 704 is developed, thereby, the process is completed. FIG. 5F illustrates a sectional shape the completed MTJ device. The advantage of the process is that it is possible to suppress the increase in cost due to no additional masks. Another advantage is that the self-alignment processes can be easily applied to the process because of the relationship between the film thickness and area of each layer.

In the process (first process) described with reference to FIGS. 5A to 5F, a SiN monolayer is used as a side wall deposition layer 702 which as a mask. However, it is desirable to use a metal side wall mask such as Ta in the viewpoint of the etching selectivity between magnetic materials and the side wall masks. Hereinafter, a process example (second process) in which Ta is used as an additional mask fabricated on the side wall deposition layer 702 is described.

Figure 6A:
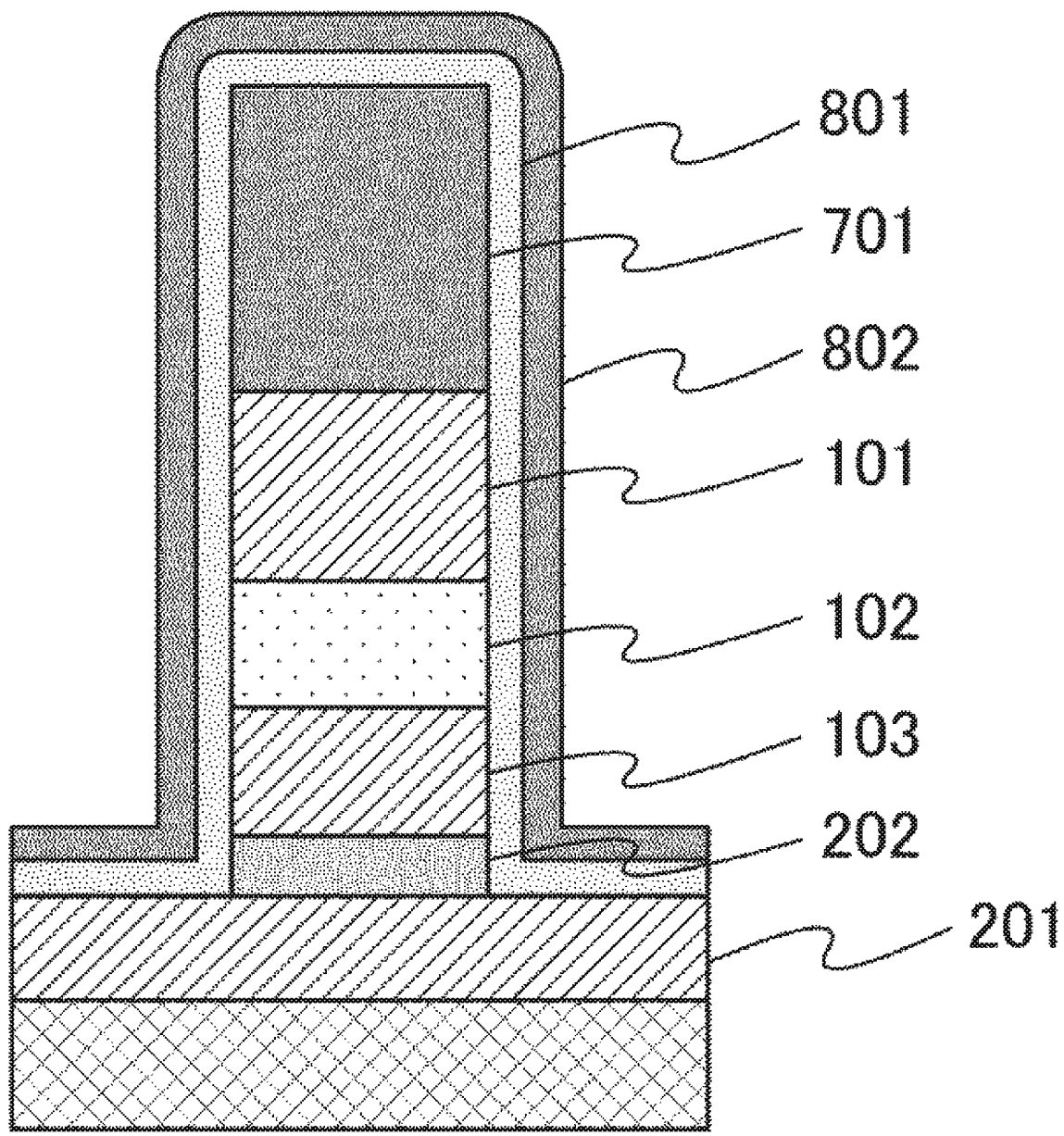
FIGS. 6A to 6C are process flows of the perpendicular magnetization MTJ device.
Figure 6B:
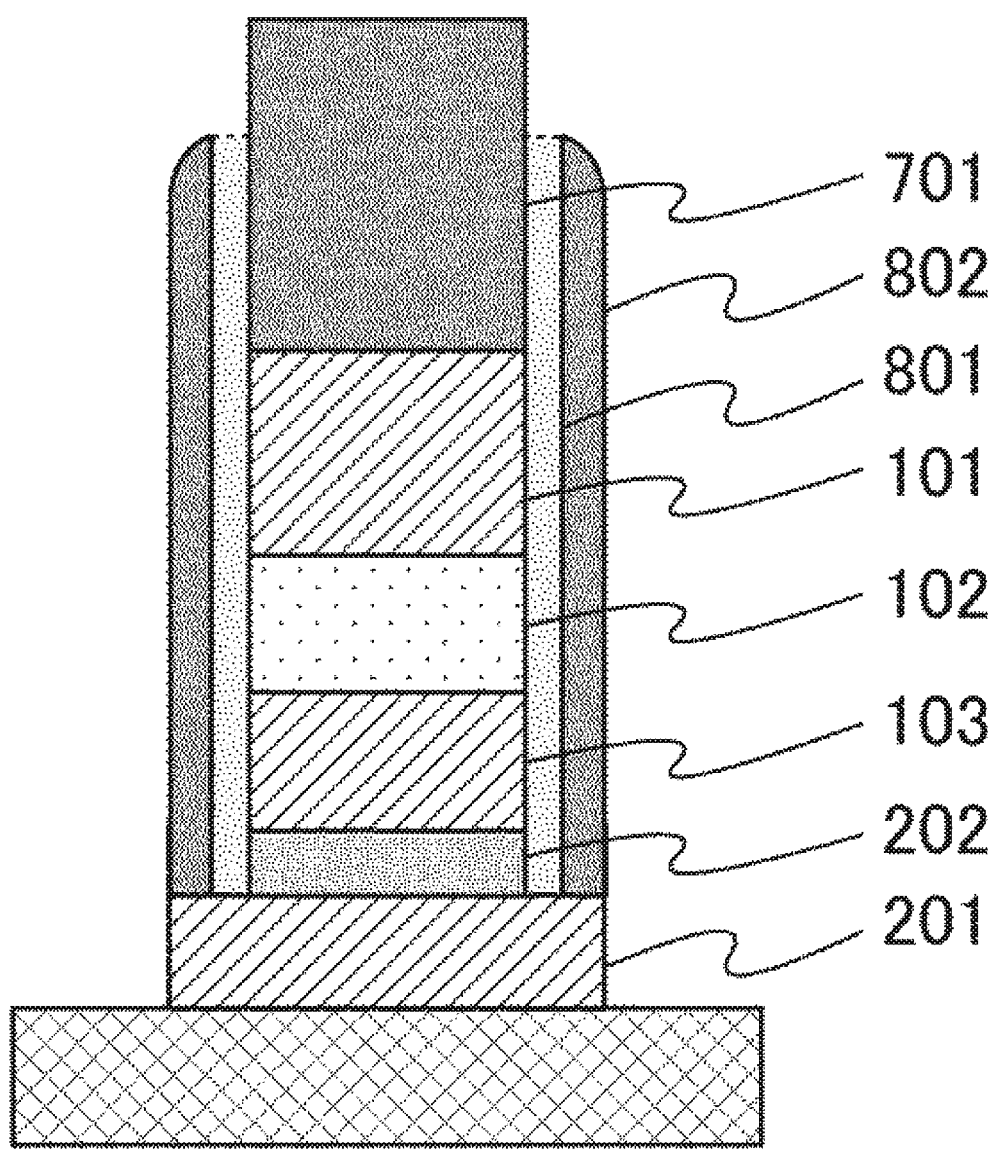
Figure 6C:
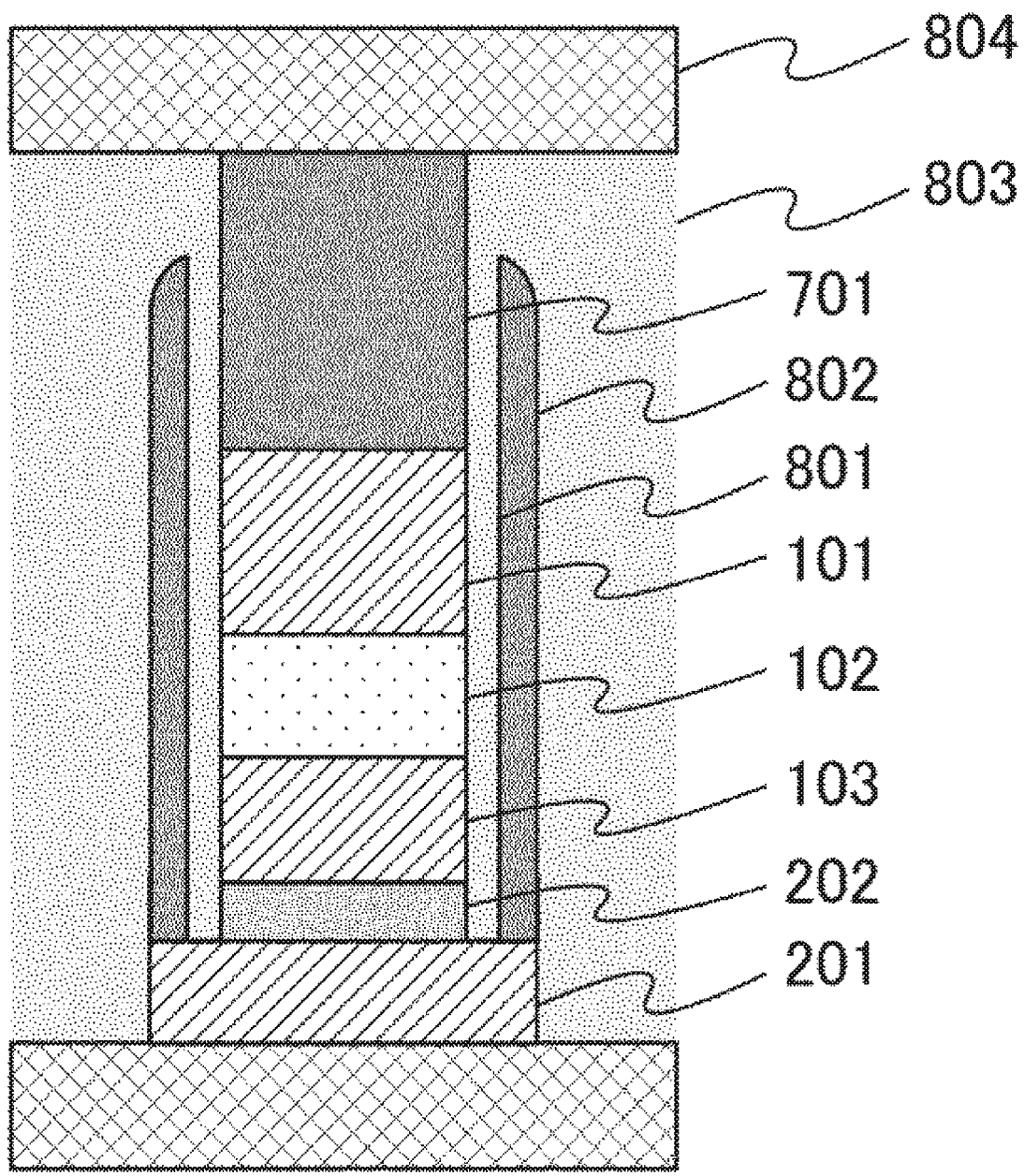

Since the same process explained in FIGS. 5A to 5C are used, in this case, the description thereof will be omitted. Thereafter, as illustrated in FIG. 6A, a side wall deposition layer 801 having the film thickness of 2 nm and a side wall metal (Ta) mask layer 802 having the film thickness of 3 nm are fabricated in this order. After that, the third ferromagnetic layer 201 is etched with the plasma etching using the side wall deposition layer 801 and the side wall metal mask layer 802 as a mask. FIG. 6B illustrates a sectional shape of MTJ device after the plasma etching of the third ferromagnetic layer 201. An interlayer insulating film 803 is added by the CVD, the top surface of the hard mask layer 701 is opened as the contact by the CMP or the etch-back treatment, and an upper electrode 804 is manufactured, thereby, the process is completed. FIG. 6C illustrates a sectional shape of the completed MTJ device.

By using the side wall metal mask which has high etching selectivity to the magnetic materials, decrease in mask during etching is strongly prevented, and a taper angle of MTJ device becomes close to 90 degrees in the shape after etching. The side wall metal mask layer 802 can be removed after the third ferromagnetic layer 201 is etched. In a case where Ta is used as a side wall metal mask layer 802, after the process of FIG. 6B, it is possible to remove Ta of the side wall metal mask layer 802 by wet etching with oxalic acid after oxidation. If the side wall metal mask layer 802 remains, since a short of the MTJ device can be caused by the side wall metal mask layer 802 as a short pass, it is possible to reduce a risk of the short in the MTJ device by removing the side wall metal mask layer 802.

It is possible to apply the first process and the second process to the manufacturing of the MTJ device illustrated in FIG. 4. In this case, sequentially stacked multilayers consisting of, from a lower side, the first magnetic multilayers, the first nonmagnetic layer, the second magnetic multilayers, the second nonmagnetic layer, the second ferromagnetic layer, the tunnel barrier, and the first ferromagnetic layer is fabricated of the lower electrode. After that, the hard mask layer for the etching process is also fabricated. The subsequent processes are similar to the first and second processes. In the structure of FIG. 4, in order to fabricate the step between the second magnetic multilayers and the first magnetic multilayers, the plasma etching is stopped at the surface of the first magnetic multilayers or in the middle of the first nonmagnetic layer (before the plasma etching reaches to the surface of the first magnetic multilayers) as illustrated in FIG. 5C.

In the embodiments described above, examples in which the steps are fabricated by making physical areas of two ferromagnetic layers, which work as the synthetic ferrimagnetic reference layer, different from each other, are explained. On the contrary, a method for fabricating an MTJ device that shows the same property by making the effective areas of two ferromagnetic layers, which work as the synthetic ferromagnetic reference layer, different from each other is described (third process), instead of the case of fabricating the steps.

Figure 7A:
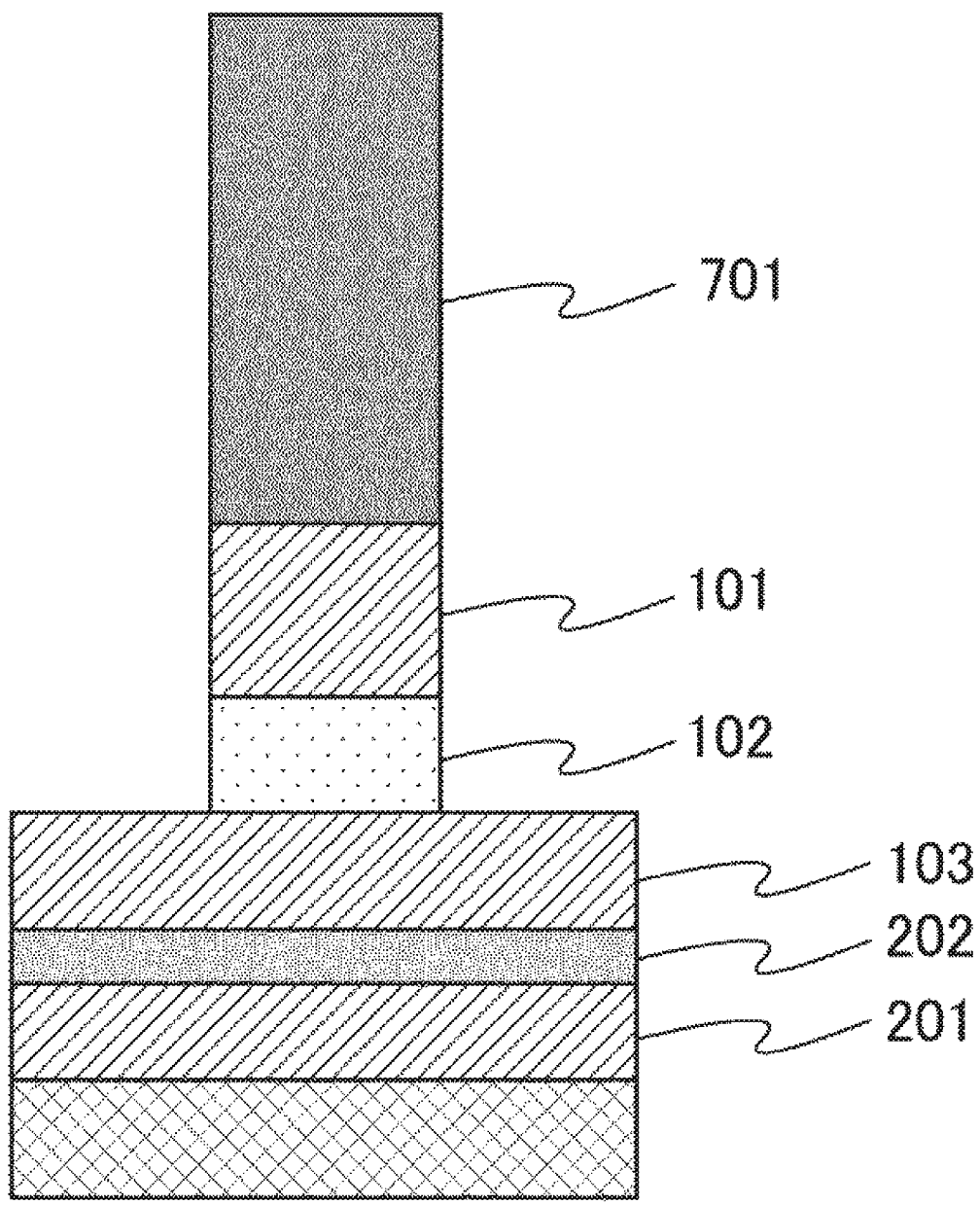
FIGS. 7A to 7E are process flows of the perpendicular magnetization MTJ device.

Since the same process explained in FIG. 5A to FIG. 5B is used, the description thereof is omitted. Thereafter, the plasma etching is performed with the hard mask layer 701 as a mask to the first ferromagnetic layer 101 and the tunnel barrier 102. FIG. 7A illustrates a sectional image of MTJ device after the plasma etching. The plasma etching is stopped at the surface of the second ferromagnetic layer 103 in FIG. 7A, however, the plasma etching can be stopped in the middle of the second ferromagnetic layer 103 (before the plasma etching reaches to the surface of the first nonmagnetic layer 202).

In the next process, the magnetization in the second ferromagnetic layer is eliminated except for the part of the second ferromagnetic layer covered by the tunnel barrier 102. One of methods for eliminating the magnetization is oxidation. As a method of oxidation, natural oxidation, plasma oxidation, or the like is a candidate. In a case of natural oxidation, oxygen is introduced after the MTJ device is transferred to a treatment chamber in which oxygen introduction is possible. At that time, it is desirable to move the MTJ device to the treatment chamber without exposing the MTJ device to the atmosphere. In a case of plasma oxidation, two cases of introducing only oxygen radicals or oxygen ions are considered. In either case, it is desirable to avoid the atmospheric exposure if the oxidation treatment is carried out in the treatment chamber which is separate from a plasma etching chamber.

Figure 7B:
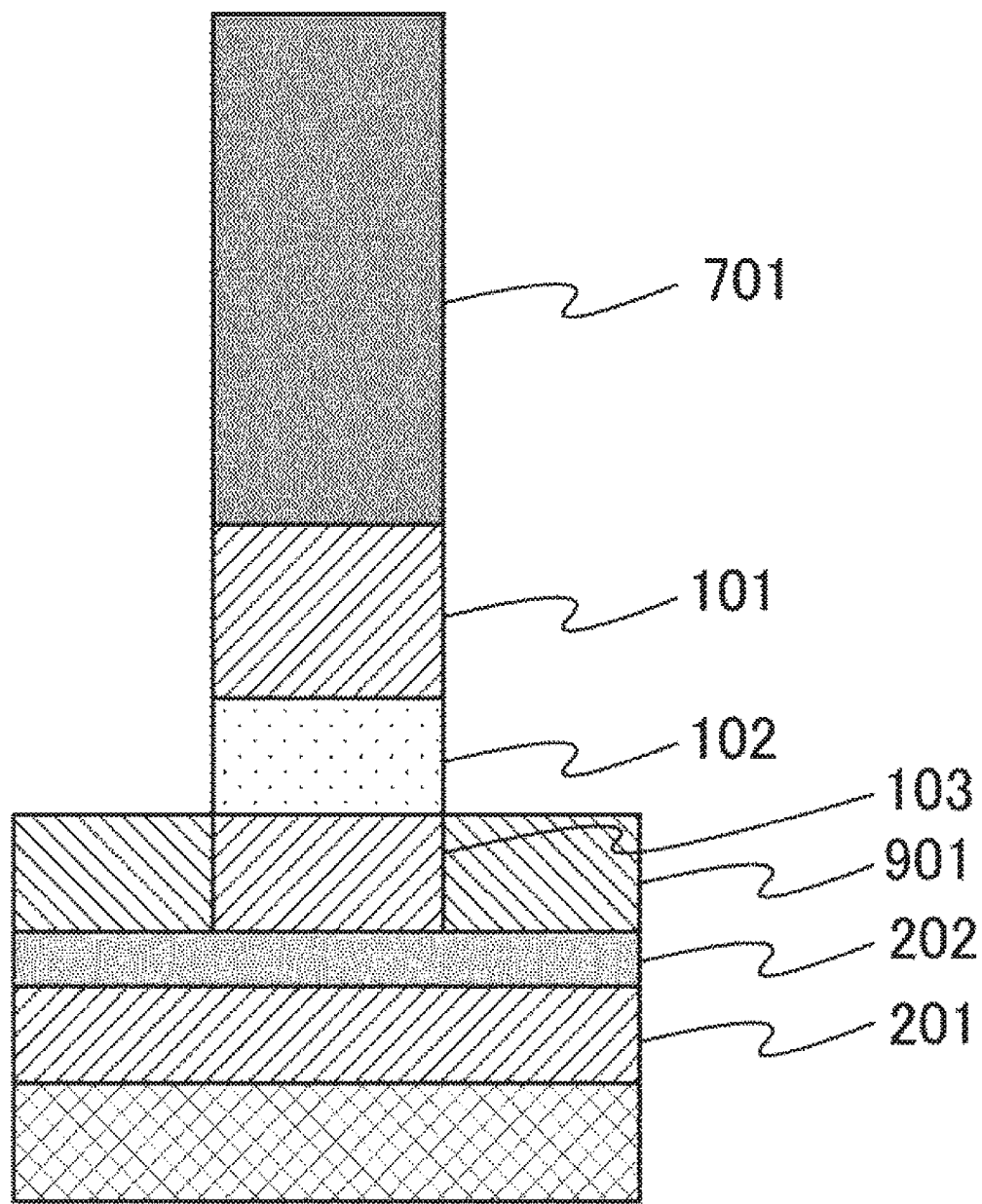

Generally, in a case of oxygen radicals, there is an advantage that a damage is small in comparison with a case where the oxygen ions are introduced. On the other hand, in a case of the oxygen ions, the damage for MTJ device is large since the ions are accelerated. However, there is an advantage that the oxidation can be promoted in comparison with the case of the oxygen radicals since the ions are implanted toward the second ferromagnetic layer 103 from the upper side. Through such a process, as illustrated in FIG. 7B, it is possible to make a magnetization elimination layer 901 in which the magnetization in the part covered by the tunnel barrier 102 remains, and the magnetization of the rest portion is eliminated.

In the process, there is an advantage that side wall redeposition materials on the side wall of the MTJ device are made into insulators by oxidation at the same time in an oxidation process of the second ferromagnetic layer 103. In this case, it is possible to prevent a leakage electrical current from the side wall.

Figure 7C:
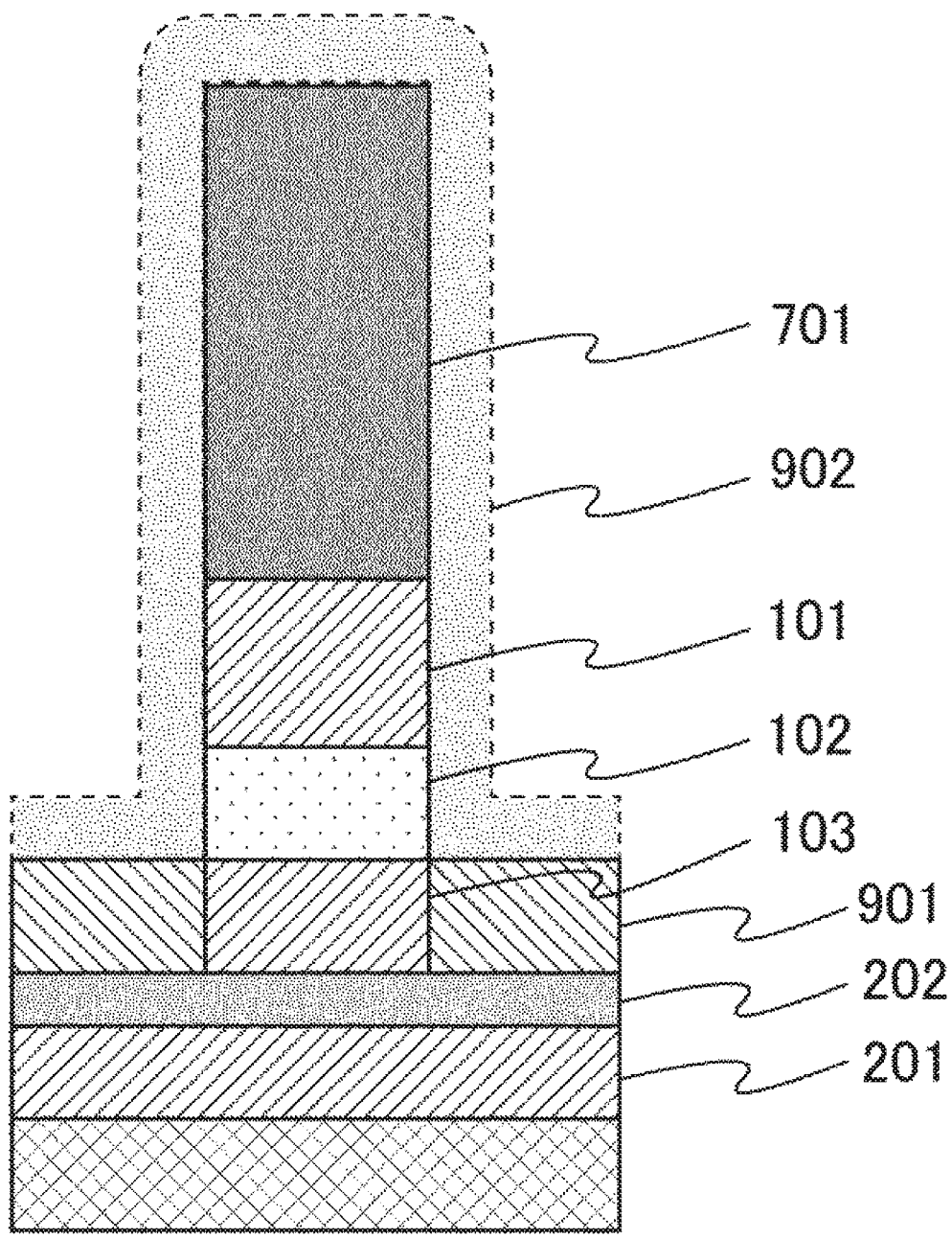
Figure 7D:
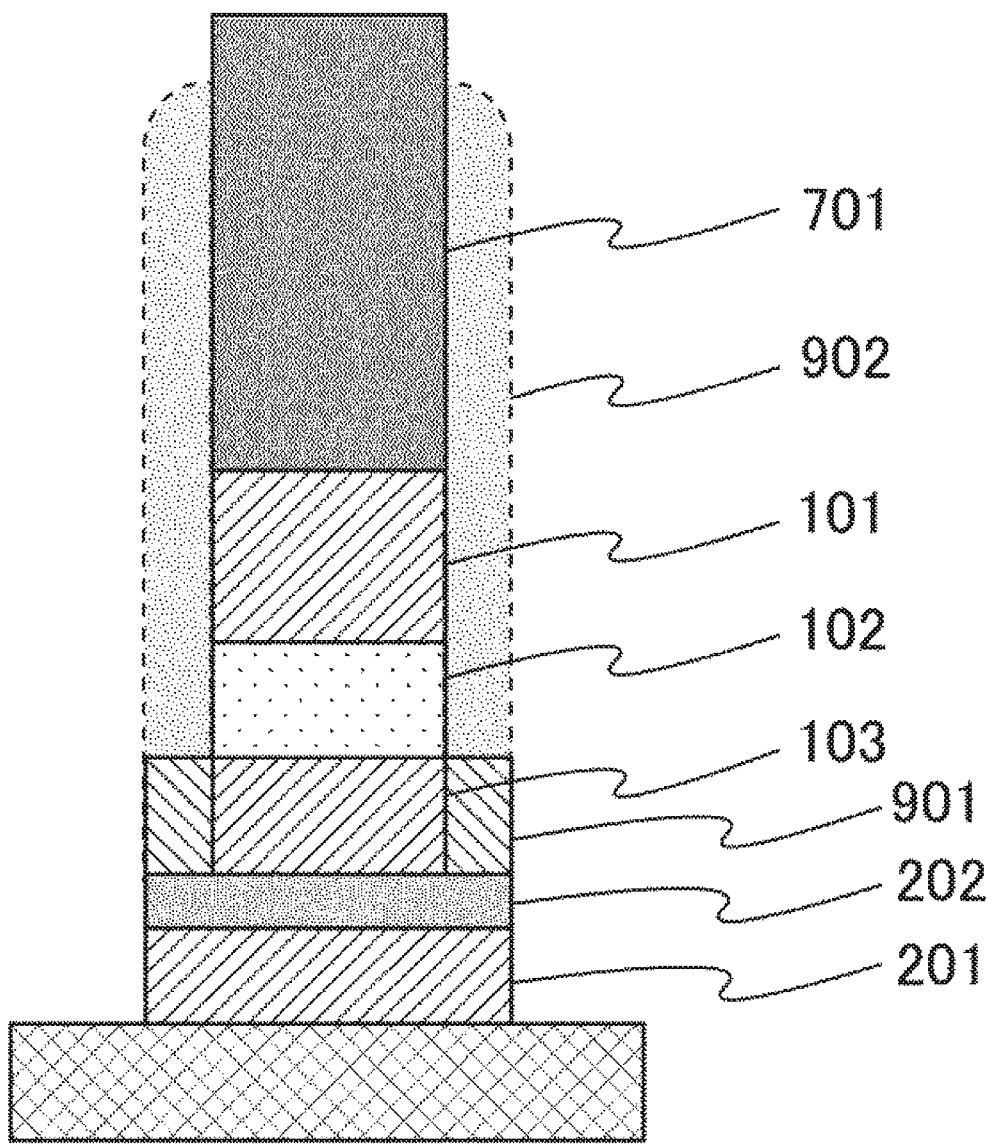
Figure 7E:
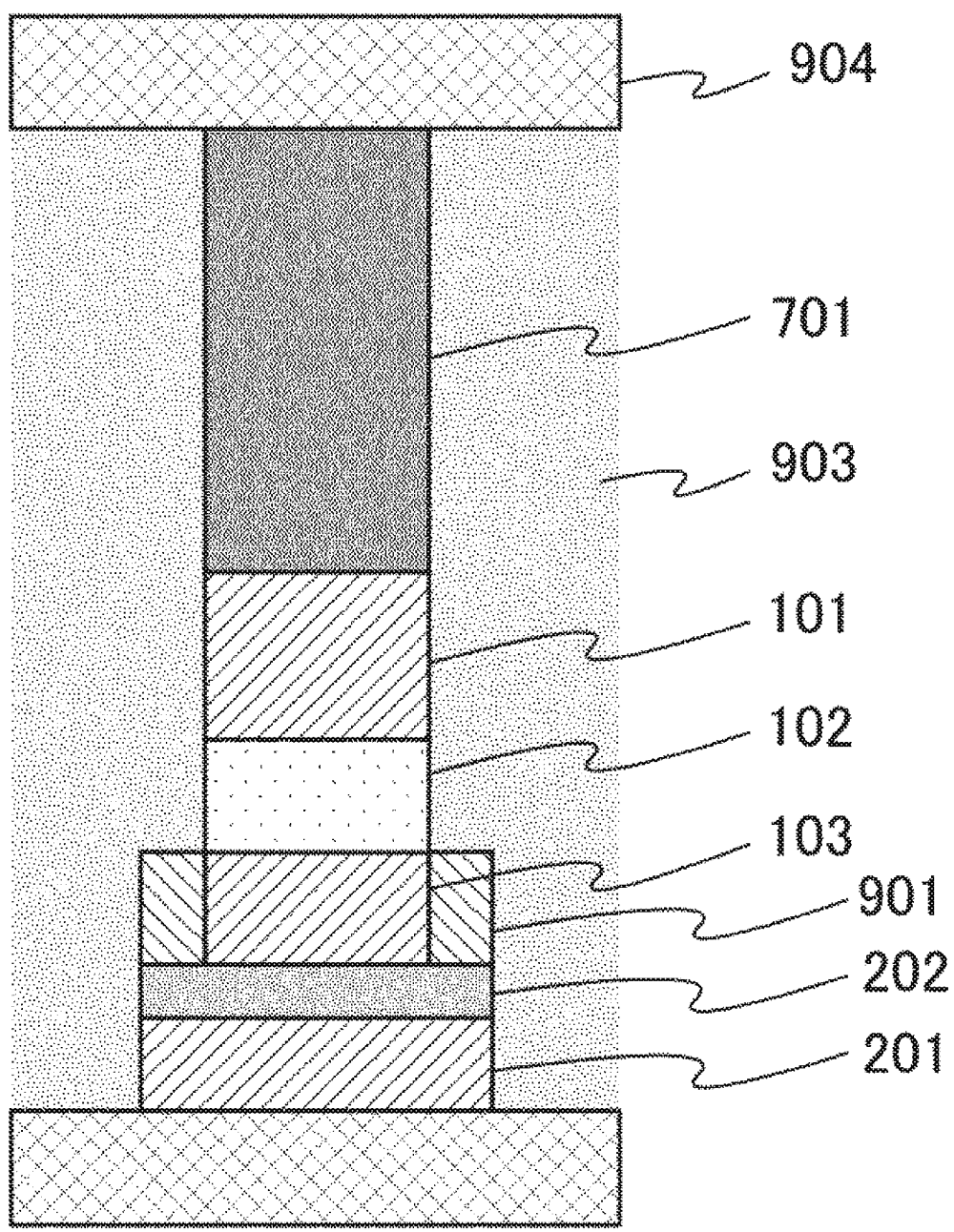

After the oxidation process, as illustrated in FIG. 7C, a side wall deposition layer 902 having the film thickness of 5 nm is fabricated by the CVD. Thereafter, the magnetization elimination layer 901, the first nonmagnetic layer 202, and the third ferromagnetic layer 201 are processed with the plasma etching using the side wall deposition layer 902 as a mask. FIG. 7D illustrates a sectional shape after the plasma etching is performed. An interlayer insulating film 903 is additionally fabricated by the CVD, the top surface of the hard mask layer 701 is opened into the contact by the CMP or the etch-back treatment. After that, an upper electrode 904 is manufactured, then, the process is completed. FIG. 7E illustrates a sectional shape after the process is completed. In this manner, although the areas of the multilayers which work as the synthetic ferrimagnetic reference layer are the same, the effective area in top ferromagnetic layer of the synthetic ferrimagnetic reference layer is reduced. As a result, it is possible to obtain the same effects as that of a case where the physical step exists. After the oxidation process, like the second process, the metal layer can be formed on the side wall deposition layer, and the plasma etching can be performed using the side wall deposition layer and the side wall metal mask layer as masks.

In the processes described above, the oxidation treatment is carried out in order to obtain the magnetization elimination layer 901. Another method for eliminating magnetization is high-energy ions irradiation by ion implantation. In this case, the film thickness of the magnetization elimination layer 901 is easily controlled since it is possible to control a penetration depth of the ions to the second ferromagnetic layer 103.

In the MTJ device which is fabricated in the third process, the first ferromagnetic layer 101 the first pillar shape with a first diameter, and the second ferromagnetic layer 103 and the third ferromagnetic layer 201 have the pillar shape with the same diameter as the first pillar, which is surrounded the magnetization elimination layer 901 where the magnetization is eliminated.

It is possible to apply the third process to the MTJ device illustrated in FIG. 4. In this case, sequentially stacked multilayers consisting of, from a lower side, first magnetic multilayers, the first nonmagnetic layer, the second magnetic multilayers, the second nonmagnetic layer, the second ferromagnetic layer, the tunnel barrier, and the first ferromagnetic layer in sequence, and the hard mask layer are fabricated on the lower electrode. The subsequent process is approximately the same as the processes described above. In the structure of FIG. 4, the process of the plasma etching illustrated in FIG. 7B is stopped at the surface or in the middle of the second magnetic multilayers (before the process of the plasma etching reaches to the surface of the first nonmagnetic layer).

In the MTJ device which is formed in the third process in this manner, the first ferromagnetic layer 101, the tunnel barrier 102, and the second ferromagnetic layer 103 have the pillar shape with the first diameter, and the second magnetic multilayers 403 with the second diameter, which is surrounded by the magnetization elimination layer 901 where the magnetization is eliminated.

EXAMPLE 2

The MTJ device of Example 1 has a structure (referred to as "bottom pin type structure") in which the recording layer is positioned above the reference layer. In the same manner, even in a structure (referred to as "top pin type structure") in which the recording layer is positioned below the reference layer can be obtained the same property as that in Example 1, the reference layer has the synthetic ferrimagnetic reference structure and the areas of two ferromagnetic layers in the synthetic ferromagnetic reference structure are made different from each other.

Figure 8:
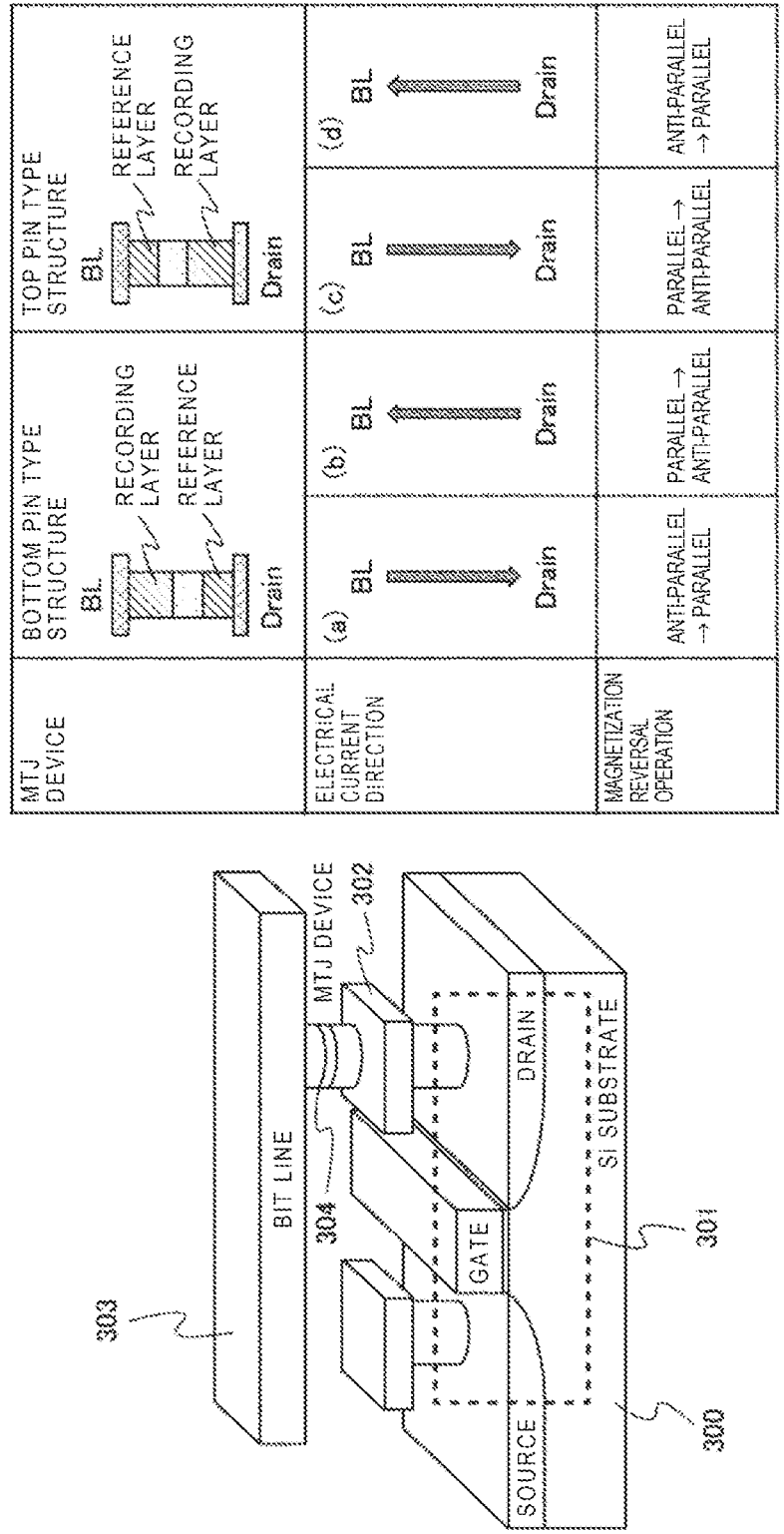
FIG. 8 is a bird's-eye view of one bit of an MRAM.

Here, the advantages of the top pin type structure is described. In the MRAM, one selection transistor is connected to one MTJ device in series. FIG. 8 illustrates a bird's-eye view of one bit of the MRAM. A selection transistor 301 is formed in a silicon substrate 300, and an MTJ device 304 is formed between a drain electrode 302 and a bit line 303 of the selection transistor 301. As illustrated in FIG. 8, the selection transistor 301 is located in a lower layer of the MTJ device 304. In this case, as illustrated in FIG. 8, the electrical current that is supplied by the selection transistor during writing of the MTJ device is small when the electrical current flows to the MTJ device from the selection transistor ((b), (d)), and is large when the electrical current flows to the selection transistor from the MTJ device ((a), (c)). On the other hand, the electrical current which is necessary to switch a magnetization of the MTJ device, is generally large in a case where the writing to the anti-parallel state from the parallel state. In a case or the bottom pin type structure, since an electrical current direction of the writing to the anti-parallel state from the parallel state corresponds to the direction to the MTJ device from the selection transistor, large electrical current supply of the selection transistor is needed in order to switch the magnetization. In a case of the top pin type structure, since the writing to the anti-parallel state from the parallel state corresponds to the direction of the electrical current flows to the selection transistor from the MTJ device. Therefore, there is an advantage that the writing to the anti-parallel state without problems even in that selection transistor of which the electrical current supply capability is relatively low.

Figure 9:
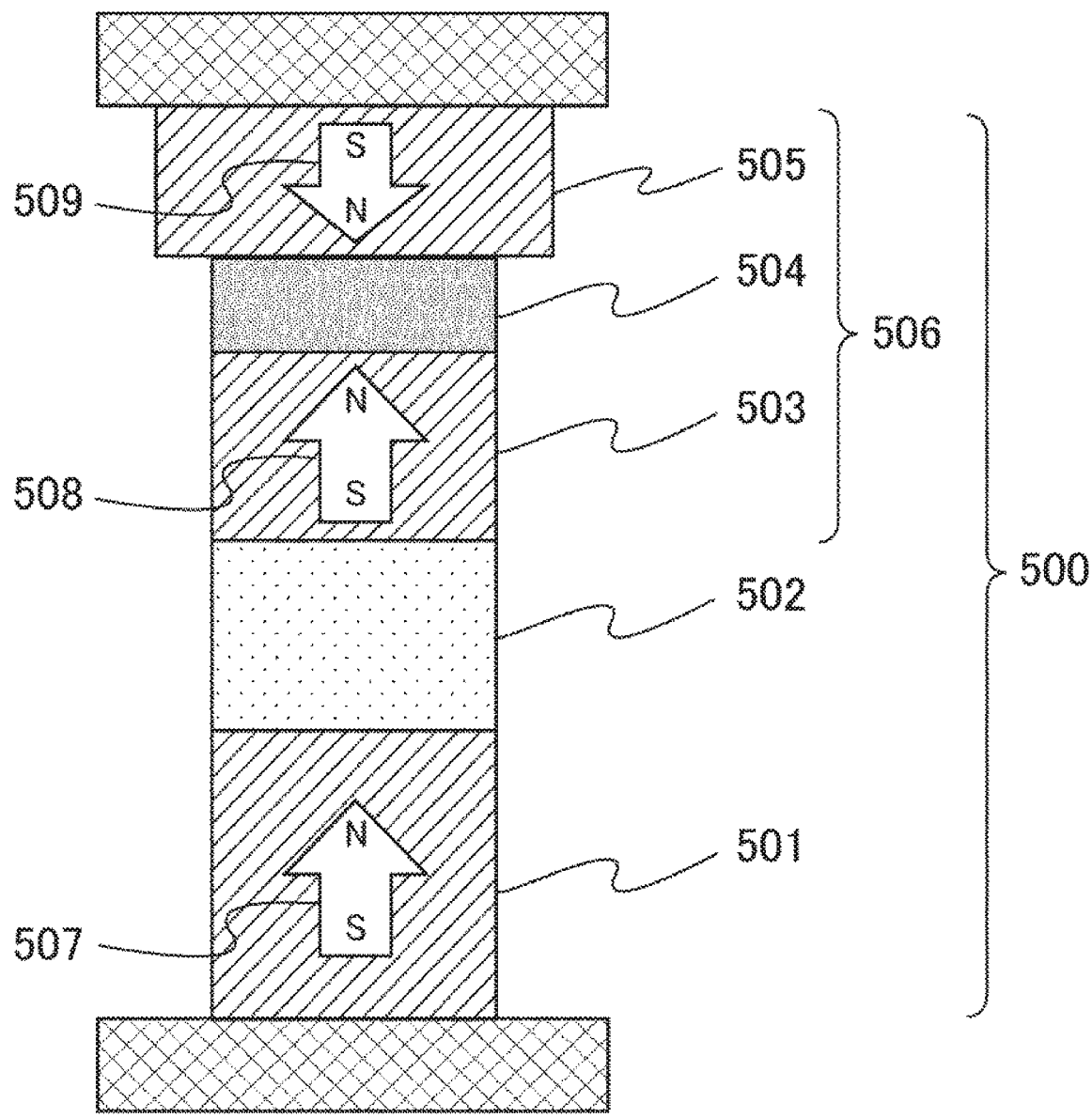
FIG. 9 is a sectional view of a perpendicular magnetization MTJ device (third structure example).

A structure (third structure example) of the MTJ device which is made into the top pin structure is described using FIG. 9. FIG. 9 is a sectional view of the MTJ device (third structure example). An MTJ device 500 is fabricated using sequentially stacked multilayers consisting of, from a lower side, a first ferromagnetic layer 501, a tunnel barrier 502, a second ferromagnetic layer 503, a first nonmagnetic layer 504, and a third ferromagnetic layer 505 on the lower electrode. A synthetic ferrimagnetic reference layer 506 consists of the second ferromagnetic layer 503, the first nonmagnetic layer 504, and the third ferromagnetic layer 505. The material and the film thickness of the first nonmagnetic layer 504 are determined such that a magnetization 508 of the second ferromagnetic layer 503 and a magnetization 509 of the third ferromagnetic layer 505 are aligned to be anti-parallel to each other. The first ferromagnetic layer 501 works as a recording layer.

The MTJ device is processed into the pillar shape, and the areas of the second ferromagnetic layer 503 and the third ferromagnetic layer 505, which works as the synthetic ferrimagnetic reference layer 506, are processed to be different from each other. In the example of FIG. 9, the area of the second ferromagnetic layer 503 is processed to be smaller than that of the third ferromagnetic layer 505. Thereby, the structure with the step between the second ferromagnetic layer 503 and the third ferromagnetic layer 505, is fabricated.

Figure 10:
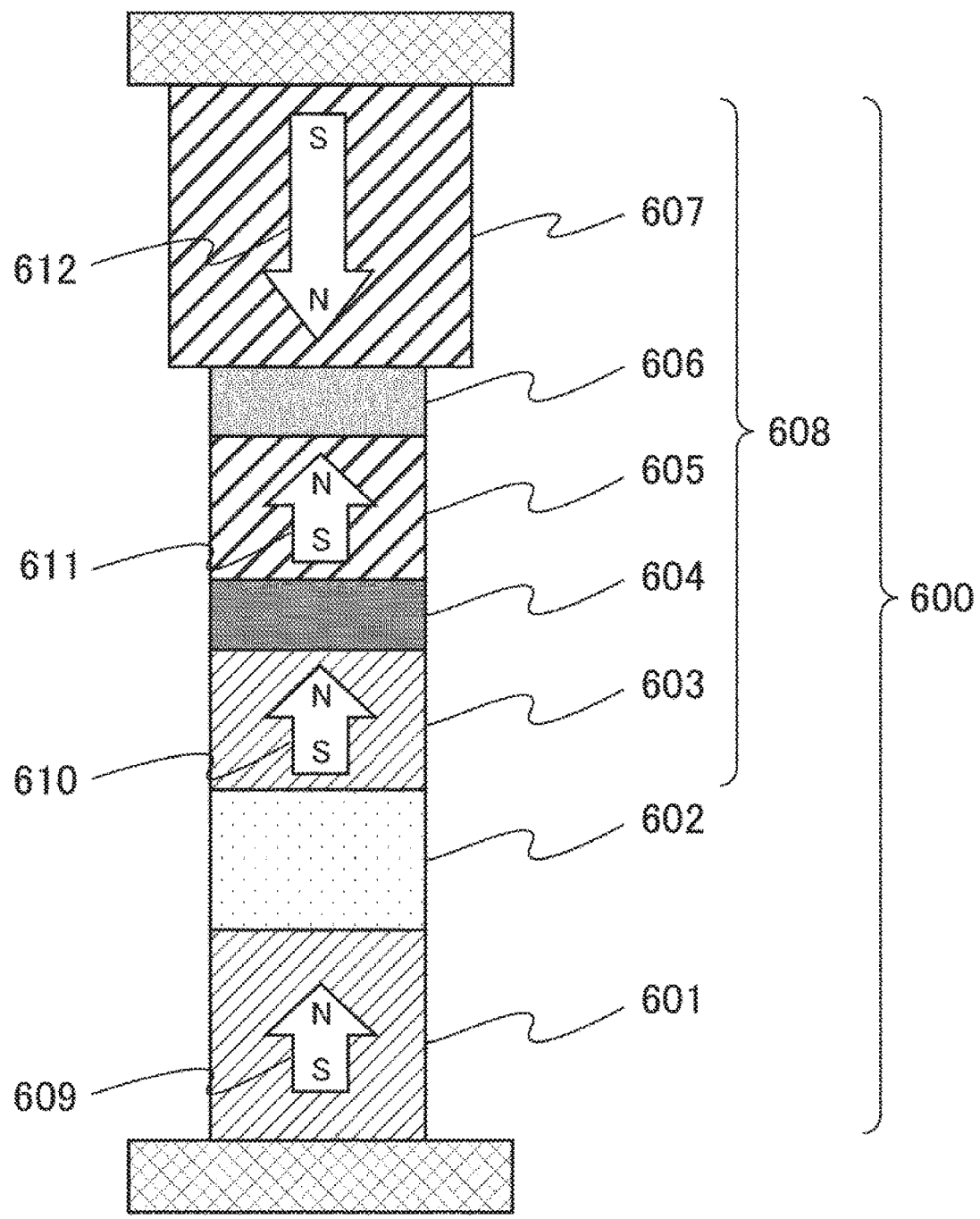
FIG. 10 is a sectional view of a perpendicular magnetization MTJ device (fourth structure example).

In the same manner, it is also possible to fabricate the top pin structure in a case where the Co/Pt multilayer film is used. FIG. 10 is a sectional view of an MTJ device 600 with the top pin structure in which the Co/Pt multilayer film is used. The MTJ device 600 is fabricated sequentially stacked multilayers consisting of, from a lower side, a first ferromagnetic layer 601, a tunnel barrier 602, a second ferromagnetic layer 603, a second nonmagnetic layer 604, second magnetic multilayers 605, a first nonmagnetic layer 606, and first magnetic multilayers 607 on the lower electrode. A synthetic ferrimagnetic reference layer 608 consists of the second ferromagnetic layer 603, the second nonmagnetic layer 604, the second magnetic multilayers 605, the first nonmagnetic layer 606, and the first magnetic multilayers 607. The material and the film thickness of the second nonmagnetic layer 604 are determined such that a magnetization 610 of the second ferromagnetic layer 603 and a magnetization 611 of the second magnetic multilayers 605 are aligned to be parallel to each other. The material and the film thickness of the first nonmagnetic layer 606 are determined such that the magnetization 611 of the second magnetic multilayers 605 and a magnetization 612 of the first magnetic multilayers 607 are aligned to be anti-parallel to each other. The first ferromagnetic layer 601 works as a recording layer.

EXAMPLE 3

Figure 11:
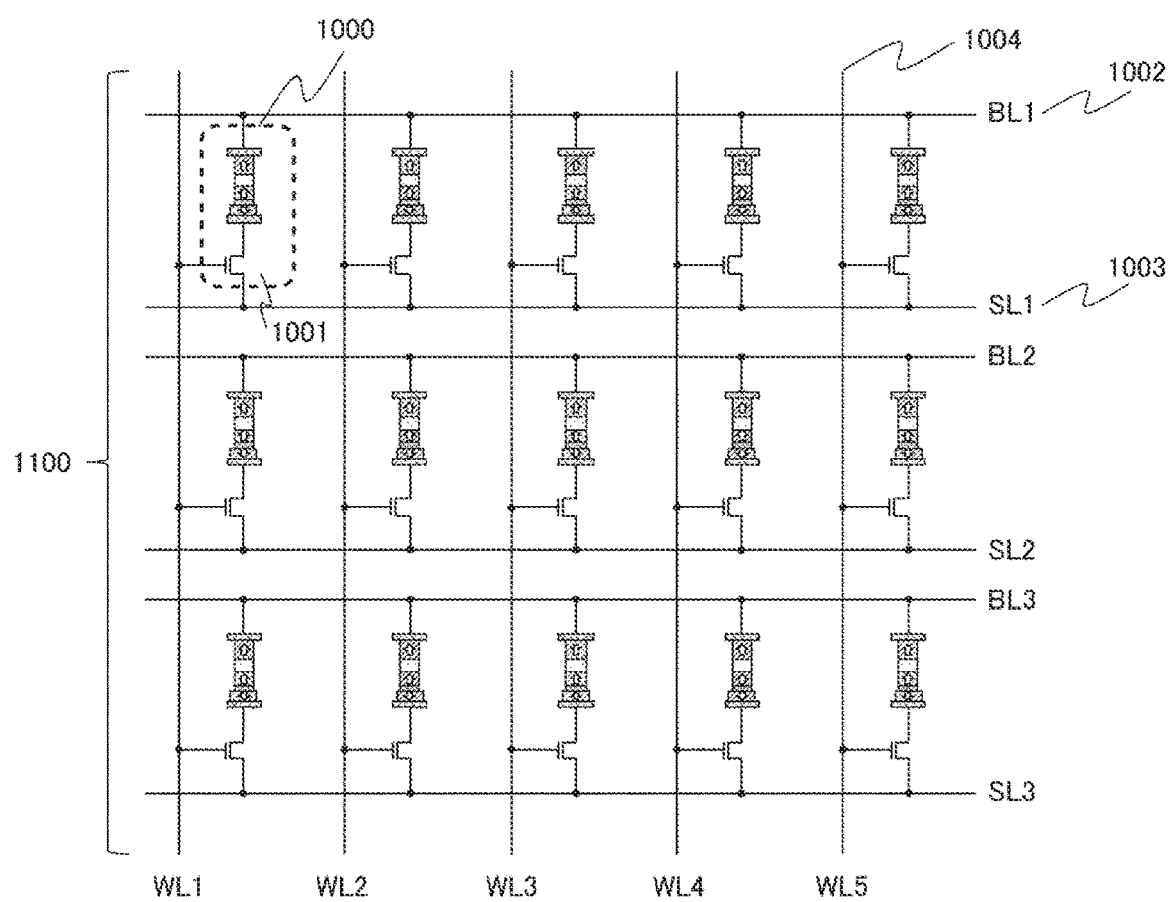
FIG. 11 is a memory cell array of the MRAM.

It is possible to develop the MRAM using the MTJ device described above as a storage element of a memory cell. FIG. 11 illustrates a memory array 1100 of the MRAM. As illustrated in FIG. 8, a memory cell 1000 is developed with the MTJ devices and the selection transistors of which a source-drain path is connected to the MTJ device in series. Here, the MTJ device 200 illustrated in FIG. 2 is used as an MTJ device.

In the MTJ device 200 of the memory cell 1000, the lower electrode which is located below the lower side of the third ferromagnetic layer 201 is electrically connected to the drain electrode of a selection transistor 1001. The upper electrode which is located on the upper side of the first ferromagnetic layer 101 is electrically connected to a bit line (BL) 1002. A source electrode of the selection transistor 1001 is electrically connected to a source line (SL) 1003 which is located to be parallel to the bit line 1002. A gate electrode of the selection transistor 1001 is connected to a word line (WL) 1004 which is located to be orthogonal to the bit line and the source line.

As illustrated in FIG. 11, a plurality of bit lines 1002, source lines 1003, and word lines 1004 are aligned, and the memory cell 1000 is located at each point in which the bit line 1002, the source line 1003, and the word line 1004 intersect with each other. Each of the bit line 1002, the source line 1003, and the word line 1004 is independently provided with a mechanism that controls a voltage.

When a specific memory cell 1000 is selected, the voltages of the bit line 1002 and the source line 1003 to which the memory cell 1000 is electrically connected are controlled, and the voltage is applied to the word line 1004 to which the MTJ device is connected, thereby, the electrical current is applied to the selection transistor 1001. For example, in a case of writing of the MTJ device 200 to a low resistance state, an electrical potential of the bit line 1002 is set to be high in comparison with the potential of the source line 1003. If the voltage is applied to the word line 1004 in the state, the electrical current flows toward the lower electrode from the upper electrode of the MTJ device 200. If the electrical current exceeds a writing threshold electrical current of the MTJ device 200, the MTJ device 200 switches to the low resistance state.

The MRAM memory array 1100 is described as an example of a device using the MTJ device, but the MTJ device can be applied to other devices such as a magnetic sensor.

Hitherto, the invention is described, but the invention is not limited to the embodiments, and various modification examples are included therein. The embodiments are described in detail in order to describe the invention such that the invention is easy to understand, and are not necessarily limited to a case where all of the described configurations are included. It is possible to add, delete, or replace other configurations, with respect to a portion of the configurations of the embodiments.

What is claimed is:

1. A magnetic tunnel junction device comprising:
an integrally formed first ferromagnetic layer that has a first magnetization direction throughout said first ferromagnetic layer;
a tunnel barrier that is in contact with the first ferromagnetic layer; and
a synthetic ferrimagnetic reference layer that faces the first ferromagnetic layer while being in contact with the tunnel barrier,
wherein the synthetic ferrimagnetic reference layer includes a second ferromagnetic layer that has the first magnetization direction while being in contact with the tunnel barrier, a third ferromagnetic layer that has a second magnetization direction which is anti-parallel to the first magnetization direction, and a nonmagnetic layer that is interposed between the second ferromagnetic layer and the third ferromagnetic layer, wherein the first magnetization direction is parallel to a direction in which the first ferromagnetic layer, the tunnel barrier, and the synthetic ferrimagnetic reference layer are stacked, wherein an entirety of a lateral dimension of said nonmagnetic layer is approximately equal to each of a lateral dimension of said first ferromagnetic layer and a lateral dimension of the second ferromagnetic layer, wherein an entirety of a lateral dimension of said third ferromagnetic layer is greater than said lateral dimensions of said first and second ferromagnetic layers and said nonmagnetic layer, wherein said lateral dimension of said third ferromagnetic layer is a lateral dimension that causes an absolute value of a stray magnetic field applied to said first ferromagnetic layer to be approximately zero, wherein said first ferromagnetic layer is a recording layer, and wherein said lateral dimension of said third ferromagnetic layer is 30 nm and said lateral dimension of said first ferromagnetic layer is 20 nm, so that a retention time of said recording layer is at a maximum.

2. The magnetic tunnel junction device according to claim 1, wherein the nonmagnetic layer is disposed in contact with the second ferromagnetic layer and the third ferromagnetic layer.

3. The magnetic tunnel junction device according to claim 2, wherein the first ferromagnetic layer, the tunnel barrier, and the second ferromagnetic layer make a shape of a first pillar, and the third ferromagnetic layer makes a shape of a second pillar that has lateral dimensions which are larger than the lateral dimensions of the first pillar.

4. The magnetic tunnel junction device according to claim 1, wherein a material of the nonmagnetic layer is Ru.

5. A magnetic random access memory comprising:

a plurality of bit lines that extend in a first direction;

a plurality of source lines that extend in the first direction;

a plurality of word lines that extend in a second direction intersecting with the first direction; and a memory cell that is located at an intersection point of each bit line and source line, with each word line, and includes the magnetic tunnel junction device according to claim 1, and a selection transistor of which a source-drain path is connected to the magnetic tunnel junction device in series, wherein the magnetic tunnel junction device and the source-drain path of the selection transistor which are connected to each other in series, are connected between the bit line and the source line, and a gate of the selection transistor is connected to the word line.

6. A method for fabricating a magnetic tunnel junction device, comprising:

forming a synthetic film which has a first ferromagnetic layer, a tunnel barrier positioned below the first ferromagnetic layer, a second ferromagnetic layer that has a first magnetization direction, positioned below the tunnel barrier, a nonmagnetic layer positioned below the second ferromagnetic layer, and a third ferromagnetic layer that has a second magnetization direction which is anti-parallel to the first magnetization direction, positioned below the nonmagnetic layer and a hard mask is formed above the first ferromagnetic layer;

patterning the hard mask layer into a shape of a pillar;

performing plasma etching of the synthetic film using the patterned hard mask layer as a mask to a surface of the third ferromagnetic layer or a middle of the nonmagnetic layer;

forming a side wall deposition layer by chemical vapor deposition on the synthetic film which is patterned; and performing plasma etching of the third ferromagnetic layer using the patterned hard mask layer and the side wall deposition layer as a mask, wherein the nonmagnetic layer has a material and a film thickness such that a magnetization direction of the third ferromagnetic layer is anti-parallel to a magnetization direction of the second ferromagnetic layer, and a synthetic ferrimagnetic reference layer of the magnetic tunnel junction device includes the patterned second ferromagnetic layer, the nonmagnetic layer, and the third ferromagnetic layer, wherein the first ferromagnetic layer is integrally formed and has a first magnetization direction throughout said first ferromagnetic layer, wherein the first magnetization direction is parallel to a direction in which the layers of the synthetic film are stacked, wherein an entirety of a lateral dimension of said nonmagnetic layer is approximately equal to each of a lateral dimension of said first ferromagnetic layer and a lateral dimension of said second ferromagnetic layer, wherein an entirety of a lateral dimension of said third ferromagnetic layer is greater than said lateral dimensions of said first and second ferromagnetic layers and said nonmagnetic layer, wherein said lateral dimension of said third ferromagnetic layer is a lateral dimension that causes an absolute value of a stray magnetic field applied to said first ferromagnetic layer to be approximately zero, wherein the nonmagnetic layer has a material and a film thickness such that a magnetization direction of the third ferromagnetic layer is anti-parallel to a magnetization direction of the second ferromagnetic layer, and wherein said lateral dimension of said third ferromagnetic layer is 30 nm and said lateral dimension of said first ferromagnetic layer is 20 nm, so that a retention time of said recording layer is at a maximum.

7. The method for manufacturing a magnetic tunnel junction device according to claim 6, wherein the side wall deposition layer is a silicon oxide or a silicon nitride.

8. The method for manufacturing a magnetic tunnel junction device according to claim 6, further comprising:

forming a metal layer on the side wall deposition layer, and performing plasma etching using the patterned hard mask layer, the side wall deposition layer, and the metal layer as a mask.

9. The method for manufacturing a magnetic tunnel junction device according to claim 8, further comprising:

removing the metal layer, after performing the plasma etching using the patterned hard mask layer, the side wall deposition layer, and the metal layer as a mask.

10. The method for manufacturing a magnetic tunnel junction device according to claim 6, wherein a material of the nonmagnetic layer is Ru.

* * * * *